(12) United States Patent
Woo

(10) Patent No.: US 11,355,371 B2
(45) Date of Patent: Jun. 7, 2022

(54) WAFER STORAGE CONTAINER

(71) Applicant: Bum Je Woo, Seongnam (KR)

(72) Inventor: Bum Je Woo, Seongnam (KR)

( * ) Notice: Subject to any disclaimer, the term of this patent is extended or adjusted under 35 U.S.C. 154(b) by 1042 days.

(21) Appl. No.: 15/775,359

(22) PCT Filed: Apr. 2, 2018

(86) PCT No.: PCT/KR2018/003877
§ 371 (c)(1),
(2) Date: May 10, 2018

(87) PCT Pub. No.: WO2019/194327
PCT Pub. Date: Oct. 10, 2019

(65) Prior Publication Data
US 2021/0166962 A1     Jun. 3, 2021

(51) Int. Cl.
*H01L 21/673* (2006.01)

(52) U.S. Cl.
CPC .. *H01L 21/67393* (2013.01); *H01L 21/67386* (2013.01)

(58) Field of Classification Search
CPC ......... H01L 21/67393; H01L 21/67386; H01L 21/67389; H01L 21/6735; H01L 21/6732
USPC ........................................................ 206/710
See application file for complete search history.

(56) References Cited

U.S. PATENT DOCUMENTS

| | | | |
|---|---|---|---|
| 5,879,458 A * | 3/1999 | Roberson, Jr. .... | H01L 21/67393 118/715 |
| 6,135,168 A * | 10/2000 | Yang ................. | H01L 21/67373 141/91 |
| 2002/0064439 A1 * | 5/2002 | Otaguro ............ | H01L 21/67265 414/217.1 |
| 2002/0124906 A1 * | 9/2002 | Suzuki .............. | H01L 21/67017 141/98 |
| 2011/0114534 A1 * | 5/2011 | Watson ............. | H01L 21/67393 206/710 |
| 2011/0210041 A1 * | 9/2011 | Okabe ............... | H01L 21/67393 206/710 |
| 2015/0030416 A1 * | 1/2015 | Sakiya ................. | B25J 11/0095 414/217.1 |
| 2017/0178942 A1 * | 6/2017 | Sakata ............. | H01L 21/67778 |
| 2017/0213752 A1 * | 7/2017 | Ogawa ............. | H01L 21/67386 |
| 2017/0221743 A1 * | 8/2017 | Kondoh ............ | H01L 21/67389 |
| 2020/0303226 A1 * | 9/2020 | Woo .................. | H01L 21/67393 |

FOREIGN PATENT DOCUMENTS

| | | |
|---|---|---|
| JP | 2014107346 | 6/2014 |
| JP | 2016225410 | 12/2016 |
| KR | 20050049647 | 5/2005 |
| KR | 20070006213 | 1/2007 |
| KR | 10-1171218 B1 | 8/2012 |
| KR | 20170076626 | 7/2017 |

* cited by examiner

*Primary Examiner* — J. Gregory Pickett
*Assistant Examiner* — Jenine Pagan

(57) ABSTRACT

The present invention relates to a wafer storage container capable of removing fumes on a wafer or removing moisture therefrom by supplying purge gas to the wafer stored in a storage chamber. More particularly, the present invention relates to a wafer storage container capable of quickly blocking an injection hole and an exhaust hole and of preventing contaminants from flowing into a storage chamber upon the blocking of the exhaust hole.

7 Claims, 17 Drawing Sheets

WAFER STORAGE CONTAINER

CROSS-REFERENCE TO RELATED APPLICATIONS

The present specification is a U.S. National Stage of International Patent Application No. PCT/KR2018/003877 filed Apr. 2, 2018, the entire contents of which are incorporated herein by reference.

TECHNICAL FIELD

The present invention relates generally to a wafer storage container and, more particularly, to a wafer storage container capable of removing fumes on a wafer or removing moisture therefrom by supplying purge gas to the wafer stored in a storage chamber.

BACKGROUND ART

In general, semiconductor devices are manufactured by performing selection and repeating a series of unit processes on wafers such as deposition, polishing, photolithography, etching, ion implantation, cleaning, inspection, thermal treatment, etc. The wafers are transferred to a predetermined location required in each process to manufacture semiconductor devices.

Such wafers require high precision processes and are stored in or transferred to and from a wafer storage container such as a front-opening unified pod (FOUP), etc. so as to avoid contamination or damage from external contaminants and impact.

In this case, process gases used during the processes, fumes that are by-products produced during the processes, etc. may not be eliminated but remain on the surfaces of the wafers. As a result, the residual substances may consequently contaminate semiconductor manufacturing equipment during the processes and etch pattern defects, etc. may occur, resulting in degrading reliability of the wafers.

In order to solve such problems, purging techniques are being developed to supply purge gas to the wafers stored in the wafer storage container to remove fumes remaining on the surfaces of the wafers or to prevent oxidation of the wafers.

In this case, fume removal of the wafer is achieved by discharging the fumes on the wafer and the purge gas together after the purge gas is injected onto an upper surface of the wafer, and prevention of oxidation of the wafer is achieved by filling the purge gas in the storage chamber in which the wafer is stored to lower humidity in the storage chamber. As such, fume removal of the wafer requires both the injection and the exhaust of the purge gas, whereas prevention of oxidation of the wafer only requires only the injection of the purge gas.

Accordingly, a technique for selectively controlling the injection and the exhaust of the purge gas in the wafer storage container capable of injecting and exhausting the purge gas has been required. It is noted that Korean Patent No. 10-1171218 (hereinafter, referred to as 'Patent Document 1') discloses technology regarding a wafer storage container capable of such control.

A wafer carrier disclosed in Patent Document 1 includes: an internal storage space in which wafers are stored; a gas supply line for allowing an inert gas to be introduced from outside and to be supplied to an injection port; a gas supply part supplying the inert gas into the wafer carrier and having a gas supply nozzle provided on the injection port and supplying the inert gas by discharging the inert gas supplied through the gas supply line into the wafer carrier supply, and a gas supply valve opened and closed to regulate flow of the inert gas supplied into the wafer carrier through the gas supply nozzle in response to a control signal received from a drive controller; an air discharge line communicating with the outside through an exhaust port to discharge air in the wafer carrier to the outside; and an air discharge part exhausting the air containing molecular contaminants in the wafer carrier, and having an air discharge nozzle provided on the exhaust port and discharging the air in the wafer carrier to the outside through the air discharge line, an air discharge valve opened and closed to regulate flow of the air discharged to the outside through the air discharge nozzle in response to a control signal received from a drive controller, and an ejector reducing air pressure in the wafer carrier and forming a negative pressure necessary for discharging the air in the wafer carrier to the outside.

The wafer carrier of Patent Document 1 having the above configuration controls the opening and closing operation for the flow of the inert gas supplied into the wafer carrier according to a real-time humidity value detected by a humidity sensor. In this case, the gas supply part is opened and closed by the gas supply valve while the air discharge part is opened and closed by the air discharge valve.

However, the wafer carrier of Patent Document 1 described above is problematic in that in a case where exhaust of the air discharge part is blocked by closing the air discharge valve, the contaminants may remain in the internal storage space.

In detail, even when the air discharge valve is closed, the contaminants that have not been exhausted are trapped in the air discharge line connecting the air discharge valve and the exhaust port to each other. Accordingly, when the inert gas is continuously supplied through the gas supply part while the air discharge part is closed, the inert gas is also introduced into the air discharge line and thus is mixed with the contaminants trapped in the air discharge line and flows into the wafer carrier, i.e., the internal storage space. As such, when the contaminants flow into the internal storage space, contamination of the wafer may occur, and humidity control of the internal storage space may not be efficiently performed, causing oxidation of the wafer.

In addition, in a case where the supplying of the inert gas from the gas supply part is shut off by closing the gas supply valve, even when the gas supply valve is closed, the inert gas in the gas supply line between the injection port and the gas supply valve is supplied into the wafer carrier. In particular, in a case where the gas supply line between the injection port and the gas supply valve has a long length, too much inert gas is unintentionally supplied into the wafer carrier.

Thus, when a user desires to quickly block the supplying of the inert gas, this may not be achieved.

DOCUMENTS OF RELATED ART

Patent Document (Patent Document 1) Korean Patent No. 10-1171218

DISCLOSURE

Technical Problem

Accordingly, the present invention has been made keeping in mind the above problems occurring in the related art, and the present invention provides a wafer storage container capable of quickly blocking an injection hole and an exhaust hole and of preventing contaminants from flowing into a storage chamber upon the blocking of the exhaust hole.

Technical Solution

In order to accomplish the above objects, the present invention provides a wafer storage container, including: a storage chamber in which a wafer received through a front opening is stored; an injection hole through which purge gas is injected into the storage chamber; an exhaust hole through which the purge gas injected into the storage chamber is exhausted; and a blocking member configured to block at least a portion of at least one of the injection hole and the exhaust hole.

Further, the wafer storage container may further include: a communication hole formed in the blocking member to communicate with at least one of the injection hole and the exhaust hole; and an actuating portion allowing the blocking member to move such that the communication hole of the blocking member and at least one of the injection hole and the exhaust hole are alternately offset from each other and thus do not communicate with each other.

Further, the actuating portion may allow the blocking member to move vertically.

Further, the actuating portion may allow the blocking member to move horizontally.

Further, the wafer storage container may further include: an injection hole wall forming at least a portion of a circumferential surface of the storage chamber and having the injection hole; an exhaust hole wall having the exhaust hole and forming a remaining portion of the circumferential surface of the storage chamber, the remaining portion not having the injection hole wall positioned thereon; and a support supporting the wafer stored in the storage chamber, wherein at least one of the injection hole wall and the exhaust hole wall is positioned between the support and the blocking member.

Further, the wafer storage container may further include: an actuating portion allowing the blocking member to move horizontally in a direction of at least one of the injection hole wall and the exhaust hole wall such that at least the portion of at least one of the injection hole and the exhaust hole is blocked.

Further, the wafer storage container may further include: an actuating portion allowing the blocking member to move such that at least the portion of at least one of the injection hole and the exhaust hole is blocked; a sensor measuring an internal atmosphere of the storage chamber; and a controller controlling operation of the actuating portion based on a value measured by the sensor.

Advantageous Effects

As described above, the wafer storage container according to the present invention has the following effects.

The blocking member directly closes the injection holes or the exhaust holes and thus can quickly block injection or exhaust of the purge gas.

It is possible to achieve quick injection or exhaust of the purge gas without considering a position of a supply valve of a supply passage or a discharge valve of a discharge passage, thus ensuring excellent compatibility of the wafer storage container.

When the blocking member blocks the exhaust holes, contaminants, such as fumes on the wafer, can be prevented from entering the storage chamber, thus preventing wafer contamination and preventing inefficient humidity control of the storage chamber.

MODE FOR INVENTION

Figure 1:
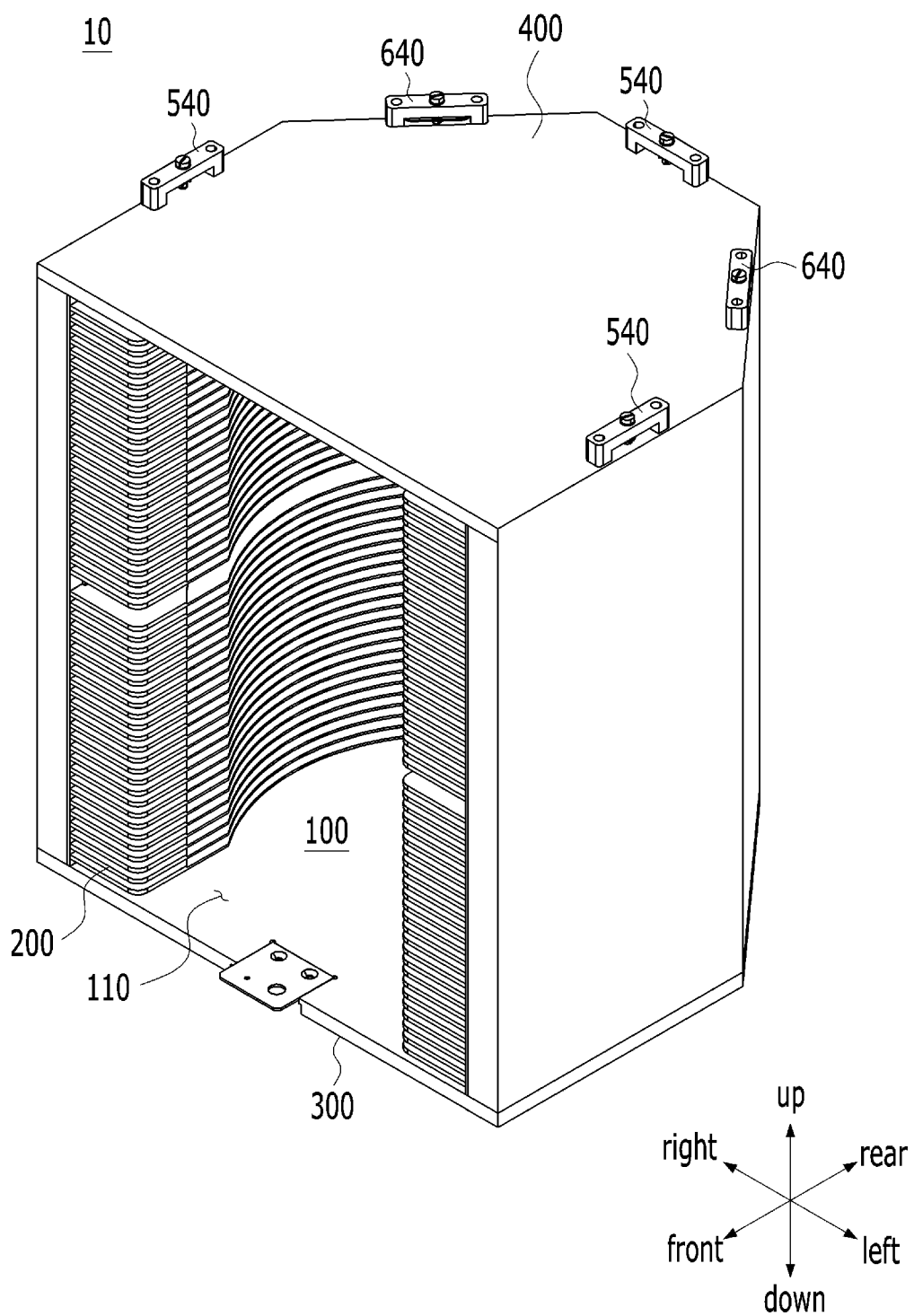
FIG. 1 is a perspective view showing a wafer storage container according to a first preferable embodiment of the present invention.

The term 'purge gas' referred to below refers generally to an inert gas for removing fumes on a wafer. In particular, it may be a nitrogen ($N_2$) gas which is used as the inert gas.

In addition, the term 'purging' refers generally to a method of preventing oxidation of the wafer by eliminating the fumes that remain on the surface of the wafer through injection of a purge gas onto the wafer, or by eliminating moisture in a storage chamber.

A wafer storage container according to the present invention includes: a storage chamber in which a wafer received through a front opening is stored; a support supporting the wafer stored in the storage chamber; a lower plate forming a lower surface of the wafer storage container; an upper plate forming an upper surface of the wafer storage container; an injection part injecting purge gas into the storage chamber; an exhaust part exhausting the purge gas injected into the storage chamber; and a blocking member configured to block at least a portion of at least one of an injection hole of the injection part and an exhaust hole of the exhaust part.

The front opening is formed in a front surface of the storage chamber, and the wafer enters and exits the storage chamber through the front opening.

The support is provided in the storage chamber and serves to support the wafer, and the wafer is received in the support through the front opening formed in the front surface of the storage chamber.

The upper plate and the lower plate constitute the upper and lower surfaces of the wafer storage container, respectively. Accordingly, the upper and lower surfaces of the storage chamber are closed by the upper plate and the lower plate.

The lower plate has a supply hole allowing an external supply part and the injection part to communicate with each other and a discharge hole allowing an external discharge part and the exhaust part to communicate with each other.

The injection part includes an injection hole wall forming at least a portion of a circumferential surface of the storage chamber and having the injection hole through which the purge gas is injected into the storage chamber, a blocking member blocking at least a portion of the injection hole, an outer wall coupled with the injection hole wall and forming an outer surface of the wafer storage container, and an actuating portion actuating the blocking member.

The exhaust part includes an exhaust hole wall having the exhaust hole through which the purge gas injected into the storage chamber is exhausted and forming at least a remaining portion of the circumferential surface of the storage chamber, the remaining portion not having the injection hole wall positioned thereon, a blocking member blocking at least a portion of the exhaust hole, an outer wall coupled with the exhaust hole wall and the blocking member and forming the outer surface of the wafer storage container, and an actuating portion actuating the blocking member.

As described above, the wafer storage container is provided with the injection part for injecting the purge gas into the storage chamber and the exhaust part for exhausting the purge gas, whereby it is possible to achieve fume removal and moisture control of the wafer stored in the storage chamber.

In other words, the injection part injects the purge gas into the storage chamber and the exhaust part exhausts the purge gas injected into the storage chamber by the injection part and the fumes on the wafer, thus achieving fume removal of the wafer. Alternatively, in a state in which the exhaust part is not allowed to perform exhaust, the injection part injects the purge gas into the storage chamber, thus achieving moisture control of the wafer.

The injection part and the exhaust part may be provided in plural depending on the size, purpose, etc. of the wafer storage container.

For example, in a case where the front opening is provided in the front surface of the storage chamber, and the circumferential surface of the storage chamber is divided into a left front surface, a left rear surface, a middle rear surface, a right rear surface, and a right front surface in an order from left to right, multiple injection parts may be disposed on the right front surface, the middle rear surface, and the right front surface of the circumferential surface of the storage chamber, and multiple exhaust parts may be disposed on the remaining left rear surface and right rear surface of the circumferential surface of the storage chamber.

Hereinafter, there will be representatively described a wafer storage container 10 according to first to third preferable embodiments, in which multiple injection parts 500 are disposed on the left front surface, the right front surface, and the middle rear surface of the circumferential surface of the storage chamber 100, and multiple exhaust parts 600 are r disposed on the left front surface and the right front surface of the circumferential surface of the storage chamber 100.

Furthermore, in the following description, for convenience of the description, the blocking member disposed at the injection part 500 is referred to as 'injection blocking member 530' and the blocking member disposed at the exhaust part 600 is referred to as 'exhaust blocking member 630'. The outer wall disposed at the injection part 500 is referred to as 'injection part outer wall 520' and the outer wall disposed at the exhaust part 600 is referred to as 'exhaust part outer wall 620'. When a communication hole formed in the blocking member is a communication hole communicating with the injection hole 511, the communication hole is referred to as 'injection communication hole 531', and when the communication hole formed in the blocking member is a communication hole communicating with the exhaust hole 611, the communication hole is referred to as 'exhaust communication hole 631'

The 'injection blocking member 530', 'exhaust blocking member 630', 'injection part outer wall 520', 'exhaust part outer wall 620', 'injection communication hole 531', and 'exhaust communication hole 631' described above are distinguished for convenience of description, so they can be understood as the terms 'blocking member', 'outer wall', and 'communication hole', respectively.

Furthermore, in the case of the actuating portion, the actuating portion actuating the injection blocking member 530 is referred to as 'injection blocking member actuating portion 540', and the actuating portion actuating the exhaust blocking member 630 is referred to as 'exhaust blocking member actuating portion 640'.

The 'injection blocking member actuating portion 540' and the 'exhaust blocking member actuating portion 640' described above are also distinguished according to whether the injection blocking member 530 or the exhaust blocking member 630 is actuated for convenience of description, so they can be understood as the term 'actuating portion'.

A Wafer Storage Container 10 According to a First Preferable Embodiment

First, a wafer storage container 10 according to a first preferable embodiment of the present invention will be described with reference to FIGS. 1 to 8.

Figure 2:
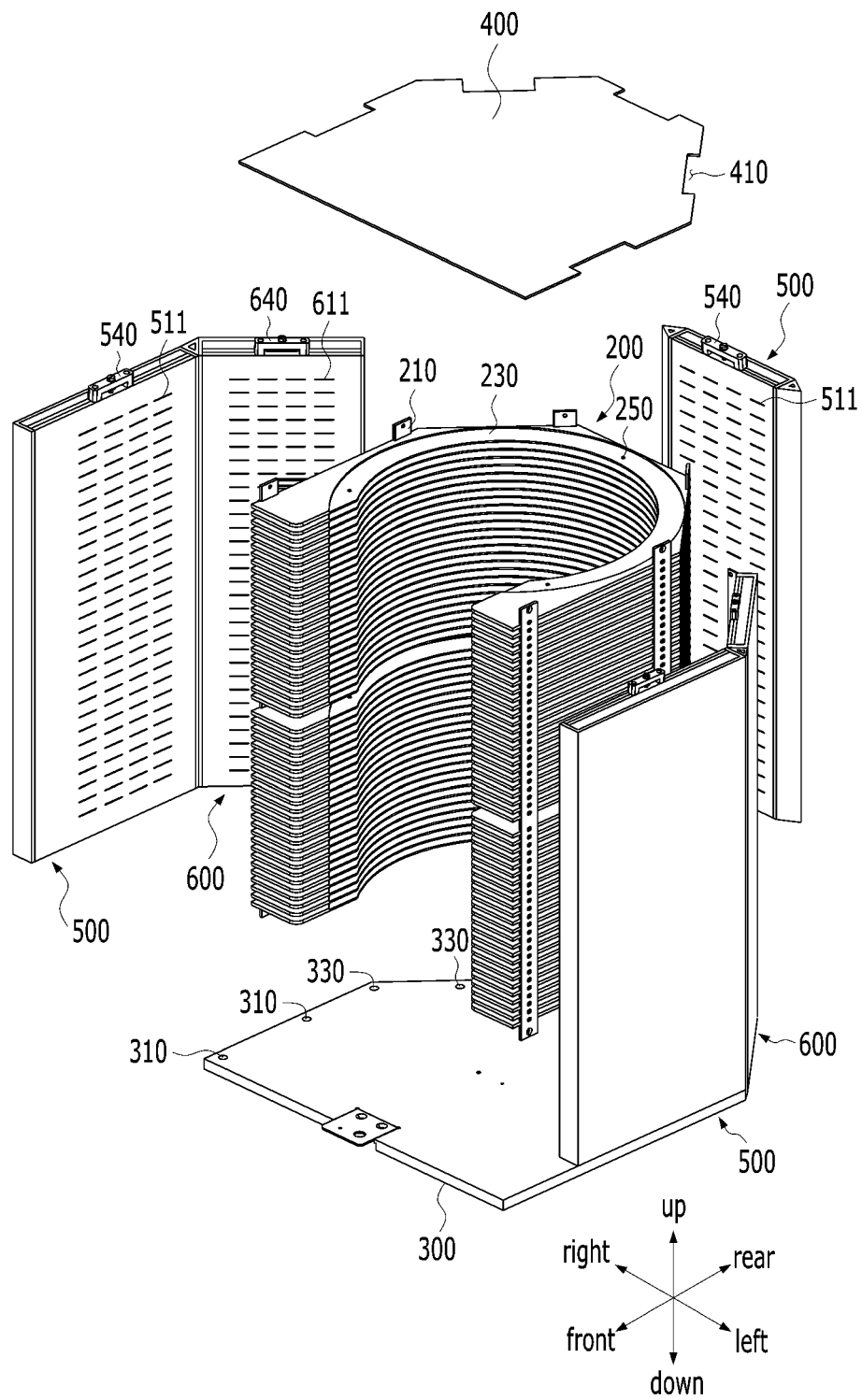
FIG. 2 is an exploded perspective view showing the wafer storage container of FIG. 1.
Figure 3:
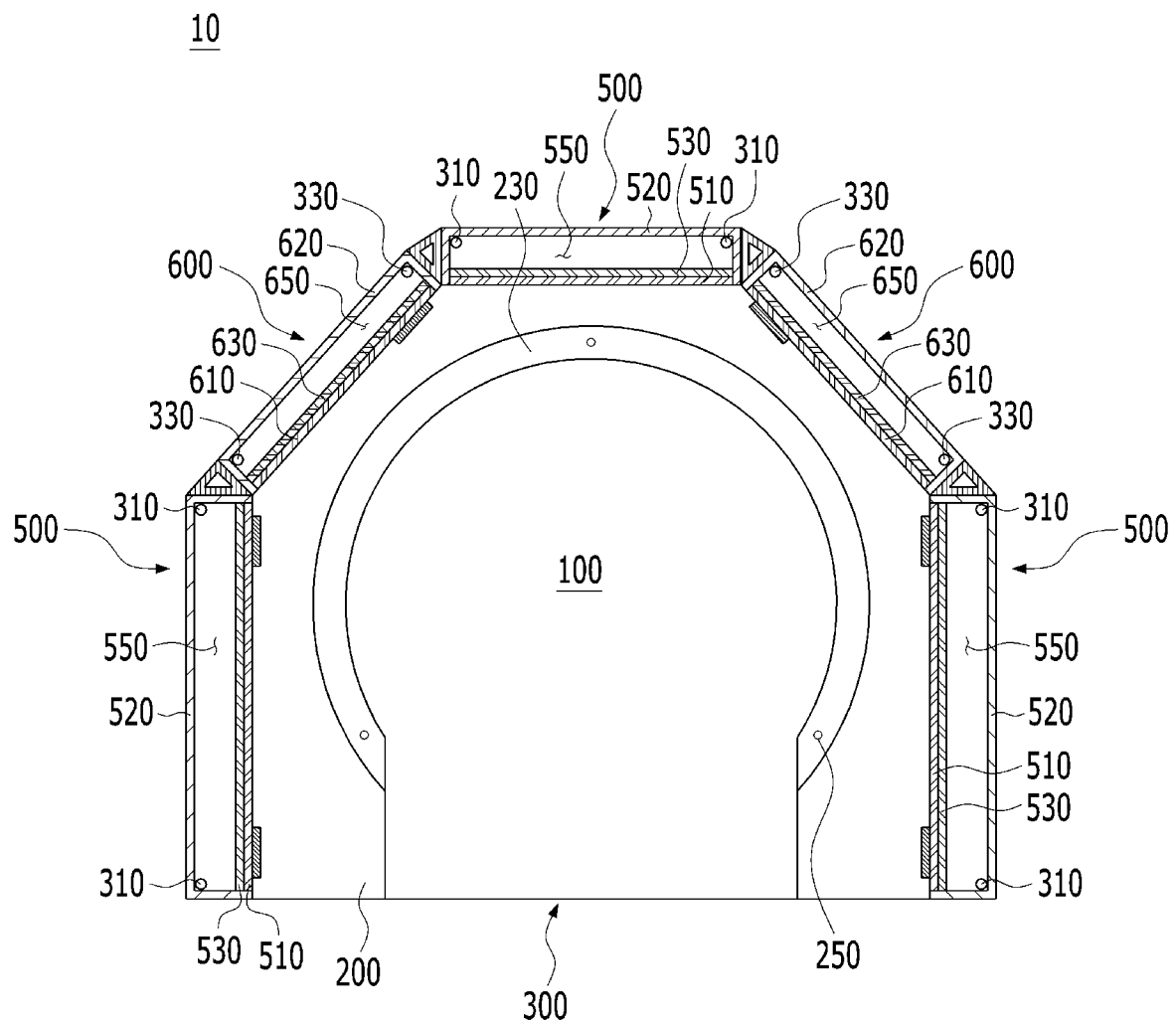
FIG. 3 is a plan cross-sectional view showing the wafer storage container of FIG. 1.
Figure 4:
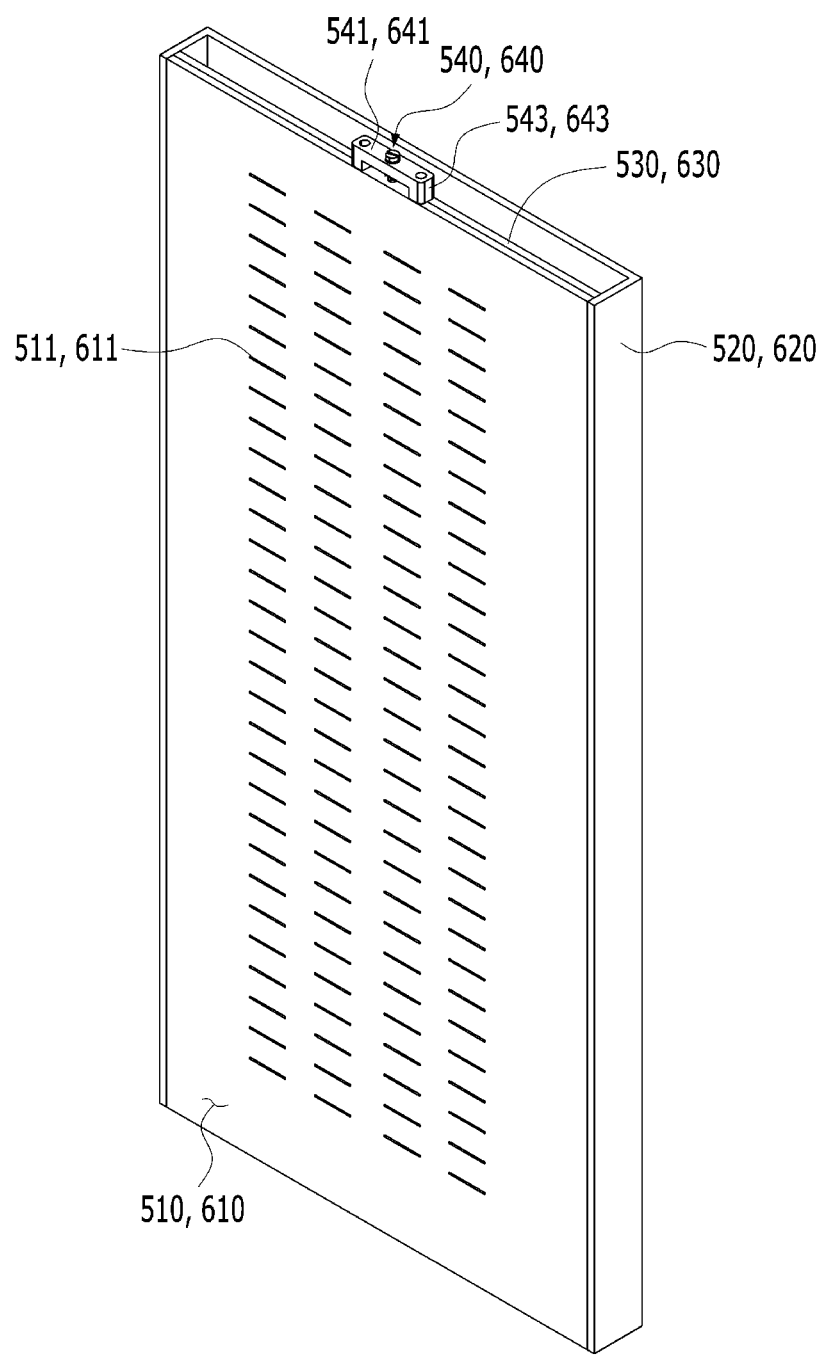
FIG. 4 is a perspective view showing an injection part (or exhaust part) of the wafer storage container of FIG. 1.
Figure 5:
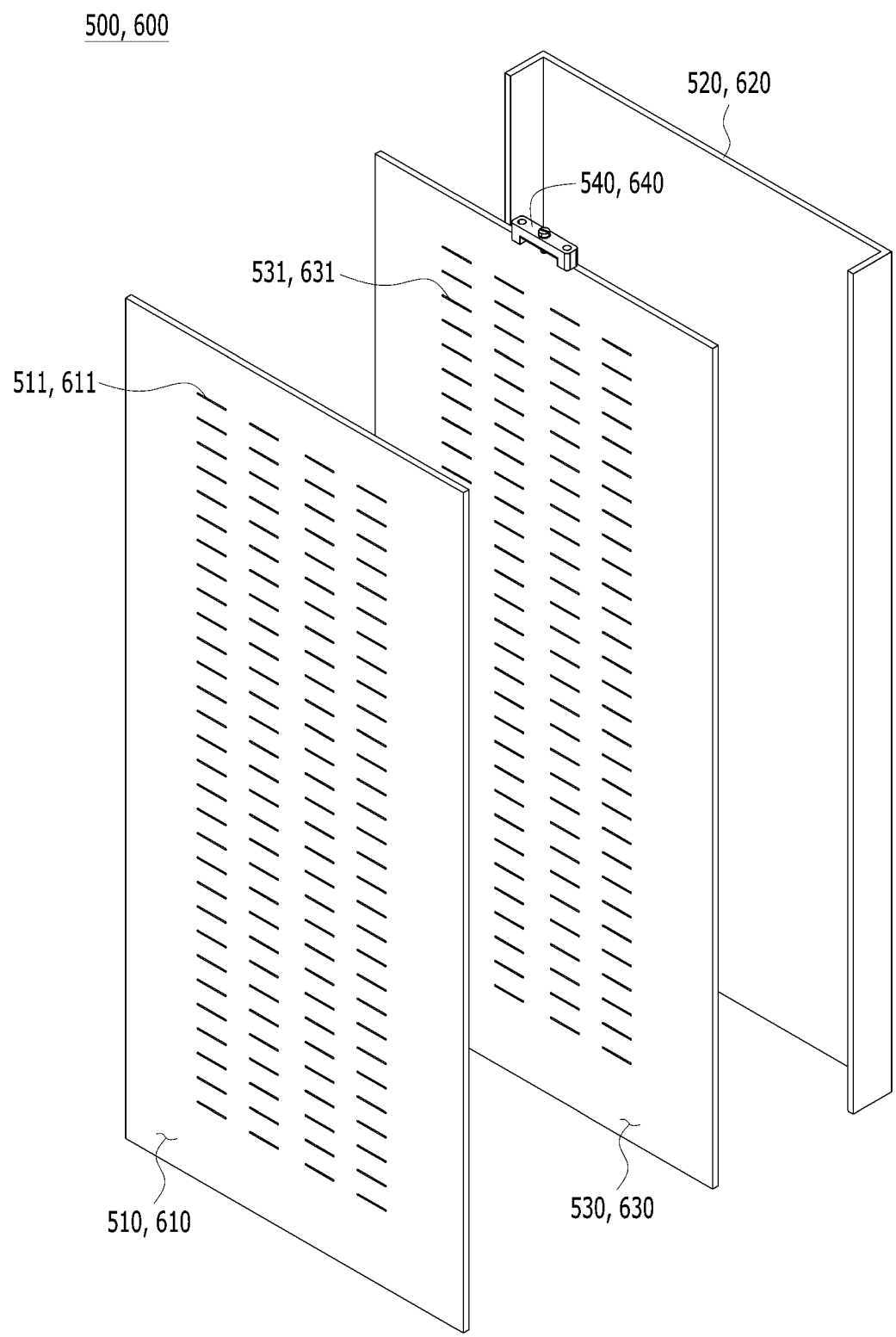
FIG. 5 is an exploded perspective view showing the injection part (or exhaust part) of the wafer storage container of FIG. 4.
Figure 6A:
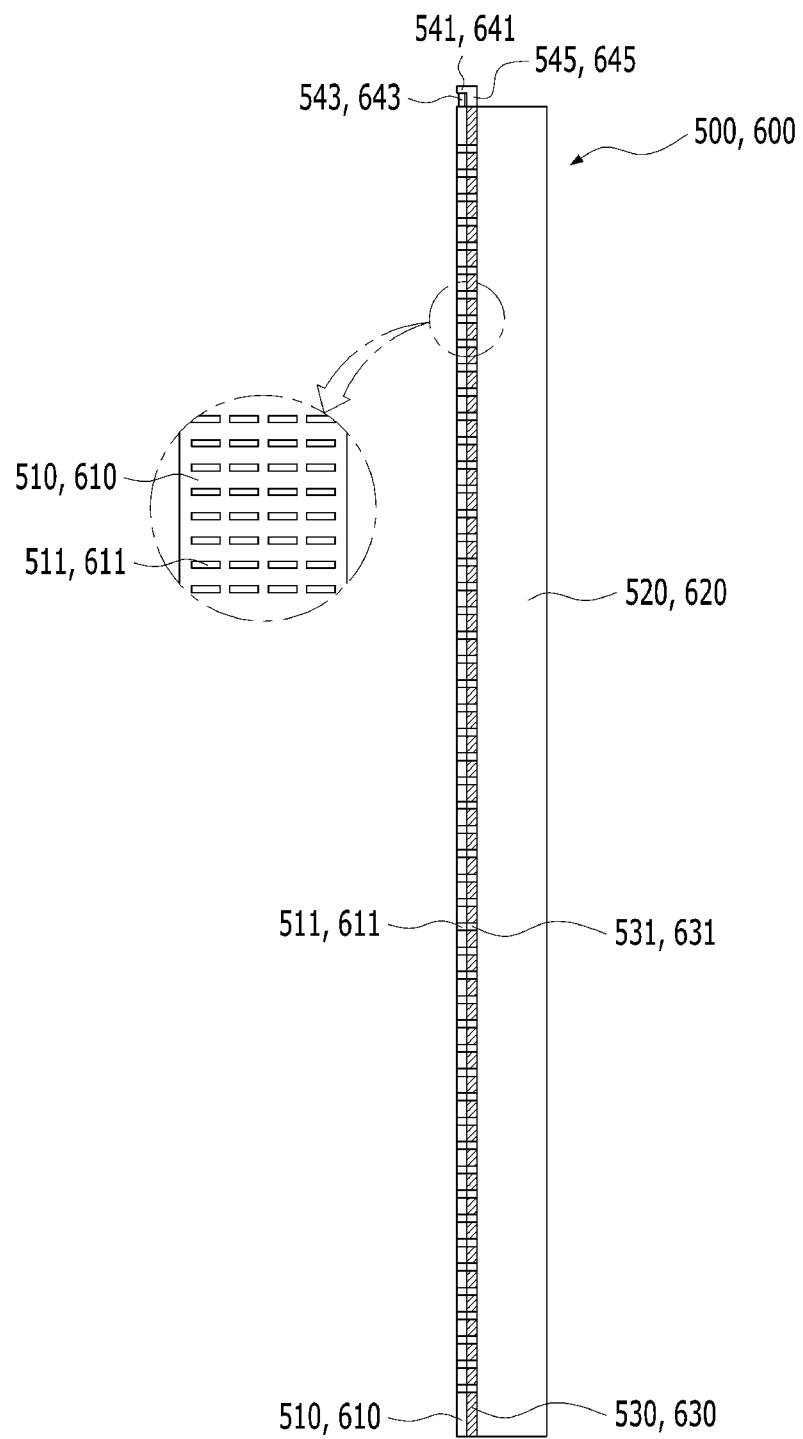
FIGS. 6a and 6b are side sectional views showing an operation state of an injection blocking member of the injection part (or exhaust blocking member of the exhaust part) of FIG. 4.
Figure 6B:
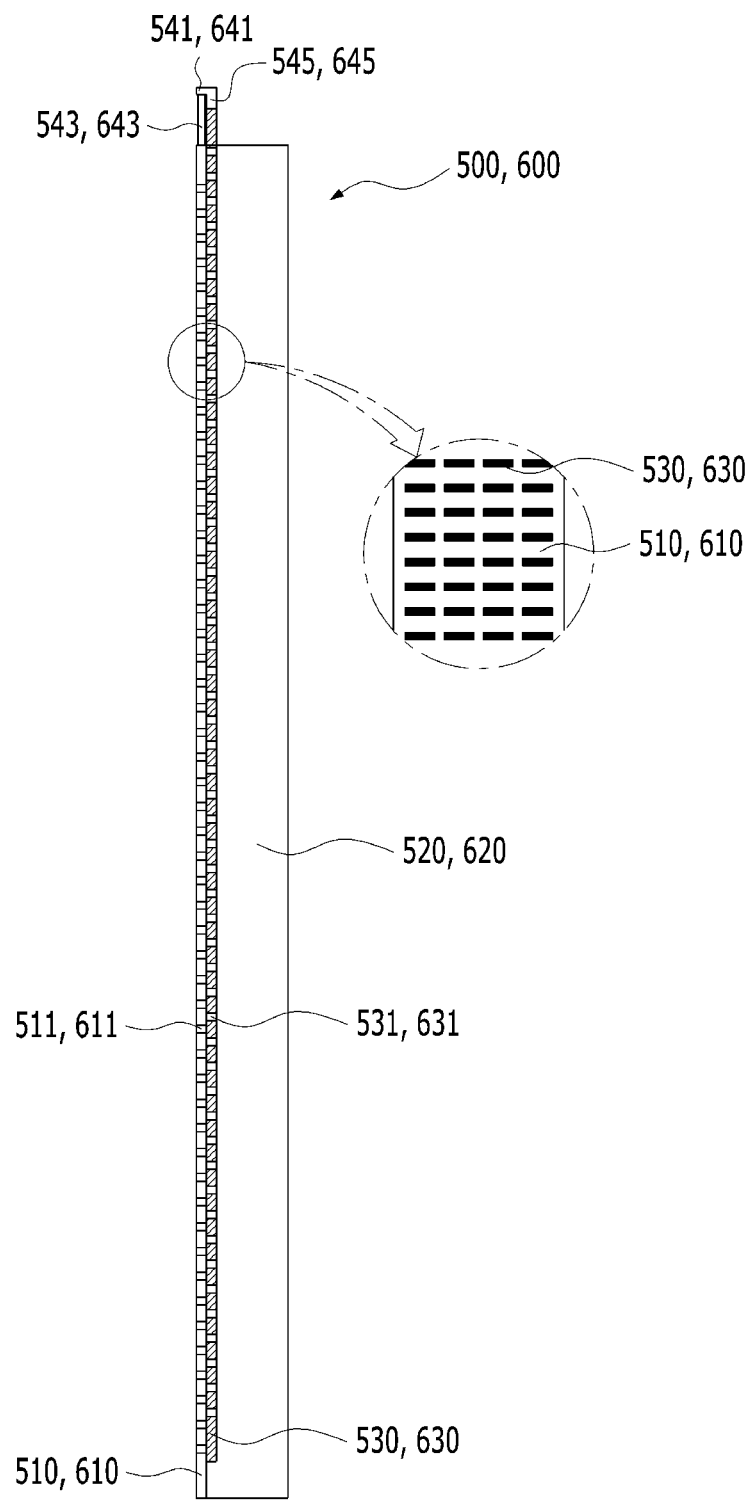
Figure 7A:
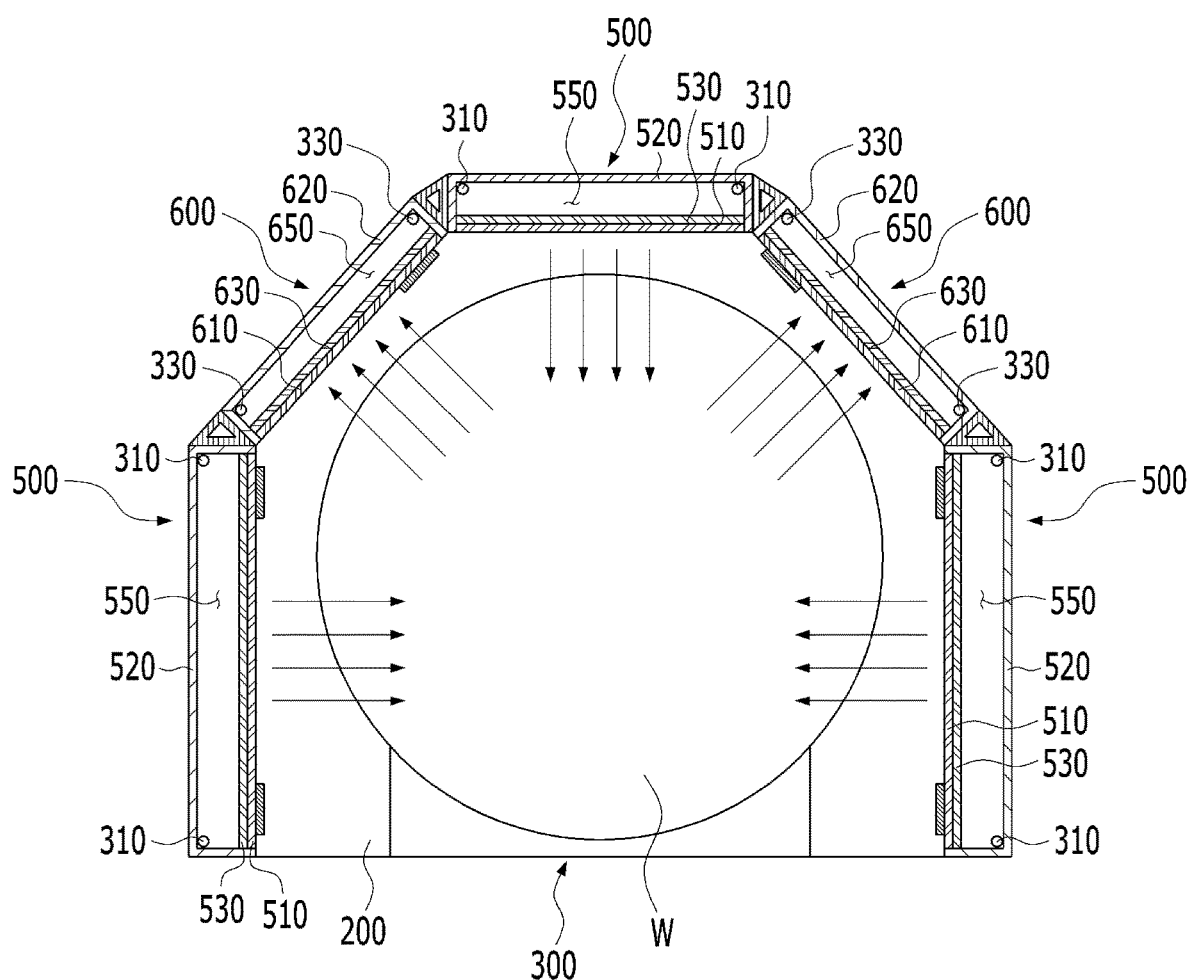
FIG. 7a is a plan cross-sectional view showing injection flow and exhaust flow of purge gas in the wafer storage container of FIG. 1.
Figure 7B:
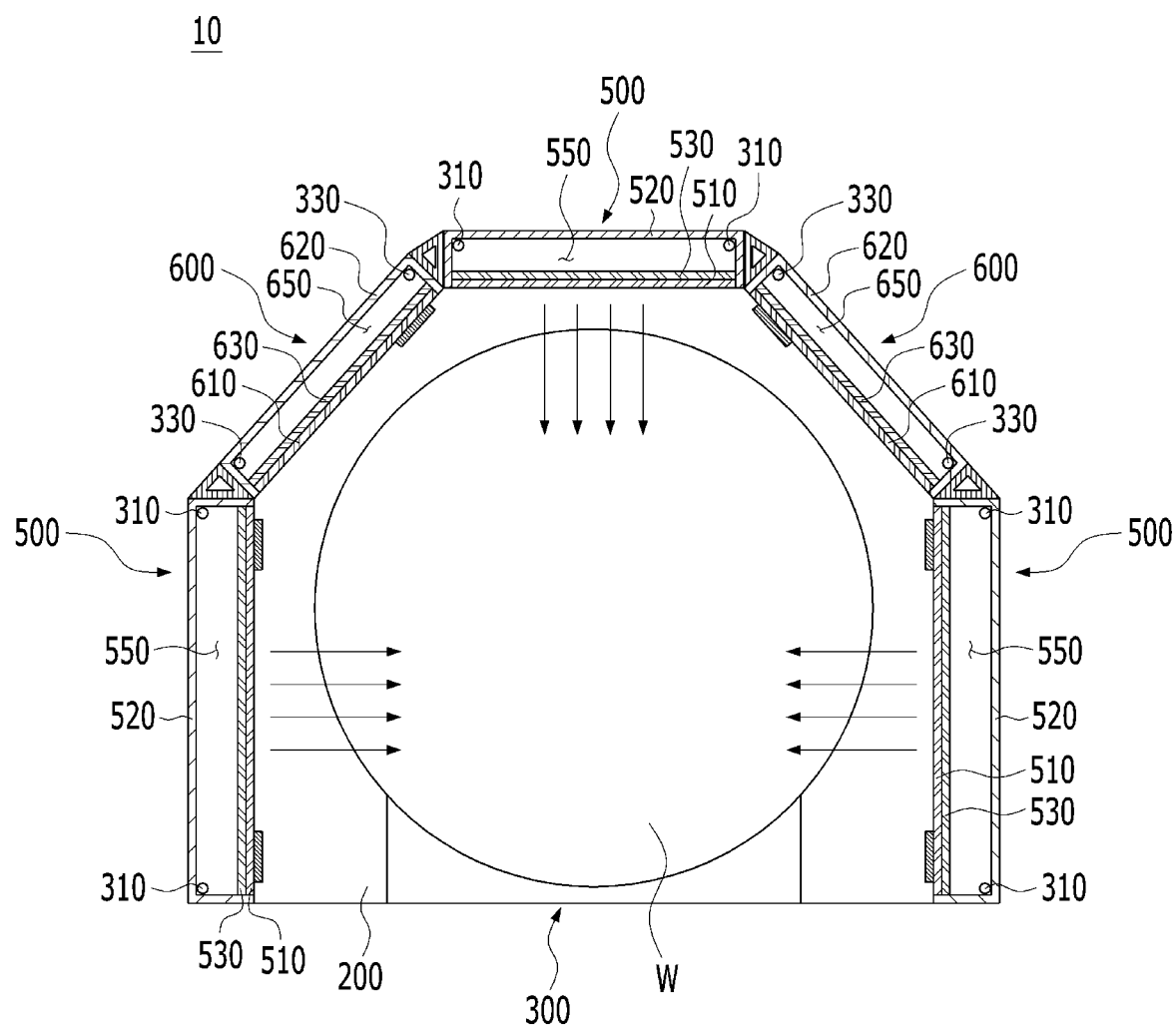
FIG. 7b is a plan cross-sectional view showing the injection flow of purge gas in the wafer storage container of FIG. 1.
Figure 7C:
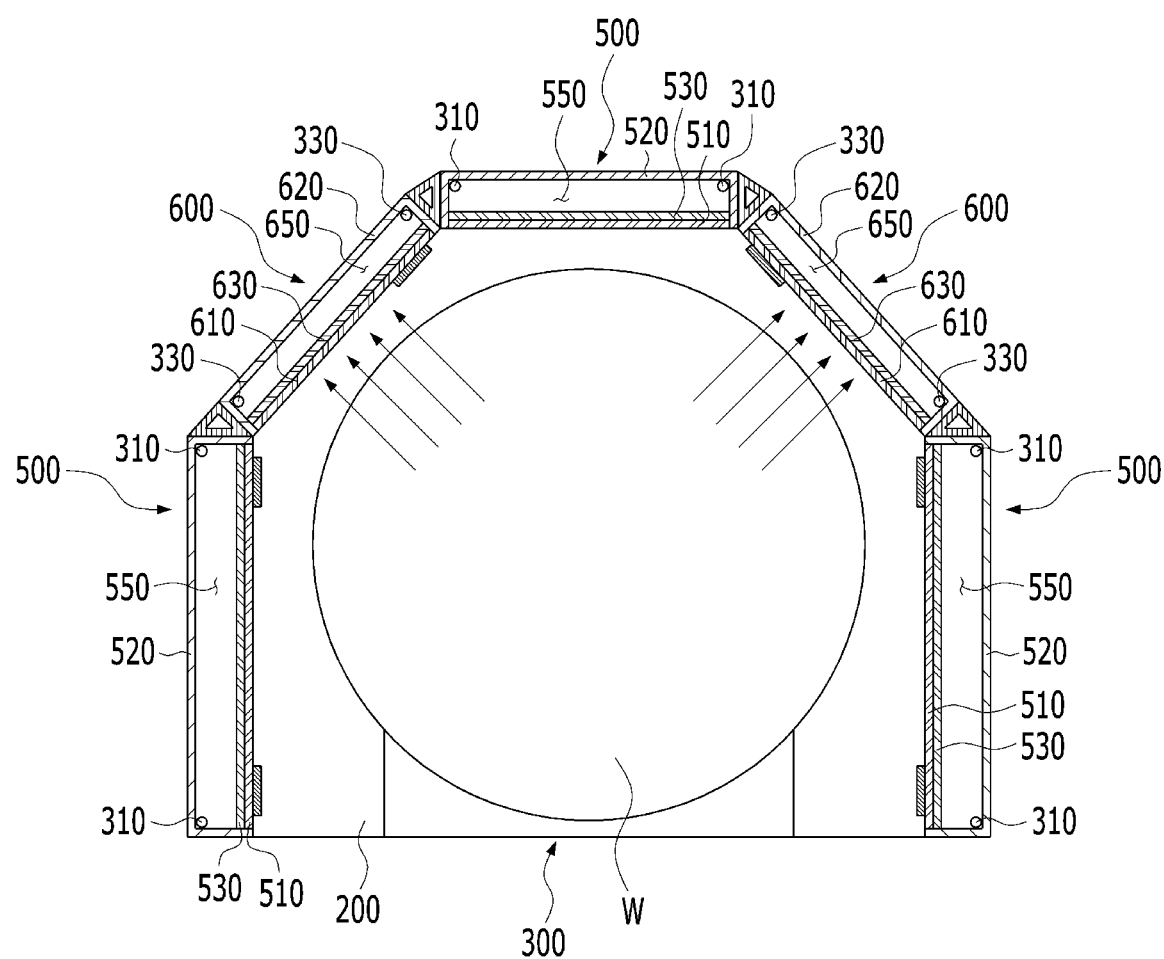
FIG. 7c is a plan cross-sectional view showing the exhaust flow of purge gas in the wafer storage container of FIG. 1.
Figure 8:
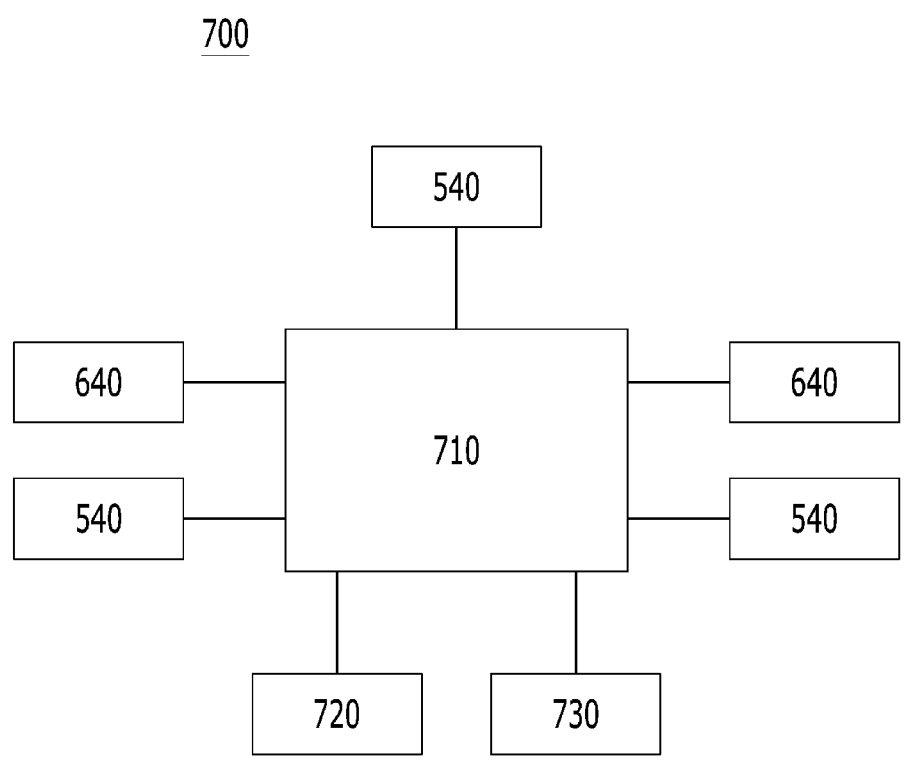
FIG. 8 is a schematic view showing a control system of the wafer storage container according to the first preferable embodiment of the present invention.

FIG. 1 is a perspective view showing a wafer storage container according to a first preferable embodiment of the present invention, FIG. 2 is an exploded perspective view showing the wafer storage container of FIG. 1, FIG. 3 is a plan cross-sectional view showing the wafer storage container of FIG. 1, FIG. 4 is a perspective view showing an injection part (or exhaust part) of the wafer storage container of FIG. 1, FIG. 5 is an exploded perspective view showing the injection part (or exhaust part) of the wafer storage container of FIG. 4, FIGS. 6a and 6b are side sectional views showing an operation state of an injection blocking member of the injection part (or exhaust blocking member of the exhaust part) of FIG. 4, FIG. 7a is a plan cross-sectional view showing injection flow and exhaust flow of purge gas in the wafer storage container of FIG. 1, FIG. 7b is a plan cross-sectional view showing the injection flow of purge gas in the wafer storage container of FIG. 1, FIG. 7c is a plan cross-sectional view showing the exhaust flow of purge gas in the wafer storage container of FIG. 1, and FIG. 8 is a schematic view showing a control system of the wafer storage container according to the first preferable embodiment of the present invention.

As shown in FIGS. 1 to 3, the wafer storage container 10 according to the first preferable embodiment of the present invention includes: a storage chamber 100 in which a wafer W received through a front opening 110 is stored; a support 200 supporting the wafer W stored in the storage chamber 100; a lower plate 300 forming the lower surface of the wafer storage container 10; an upper plate 400 forming the upper surface of the wafer storage container 10; an injection part 500 injecting the purge gas into the storage chamber 100; an exhaust part 600 exhausting the purge gas injected into the storage chamber 100; and a blocking member provided to block at least a portion of at least one of an injection hole 511 of the injection part 500 and an exhaust hole 611 of the exhaust part 600.

In this case, the blocking member may be configured with an injection blocking member 530 disposed at the injection part 500 and an exhaust blocking member 630 disposed at the exhaust part 600.

A Storage Chamber 100

Hereinafter, the storage chamber 100 will be described.

As shown in FIGS. 3, 7a, 7b, and 7c, the storage chamber 100 functions to store the wafer W therein and is defined as an internal space surrounded by the circumferential surface formed by the injection parts 500 disposed on the left front surface, the right front surface, and the middle rear surface and by the exhaust parts 600 disposed on the left rear surface and the right rear surface.

The front opening 110 is formed in the front surface of the storage chamber 100, and entrance and exit of the wafer W are allowed through the front opening 110.

The upper surface of the storage chamber 100 is formed of the upper plate 400 and the lower surface of the storage chamber 100 is formed of the lower plate 300. The circumferential surface of the storage chamber 100 is formed of the left front surface, the left rear surface, the middle rear surface, the right rear surface, and the right front surface in an order from left to right.

In this case, the injection parts 500 are respectively disposed on the left front surface, the right front surface, and the middle rear surface, and the exhaust parts 600 are respectively disposed on the left rear surface and the right rear surface.

The upper and lower surfaces of the storage chamber 100 are closed by the upper plate 400 and the lower plate 300 except for the front surface having the front opening 110 formed thereon. Further, the left front surface, the right front surface, and the middle rear surface of the storage chamber 100 are closed by the multiple injection parts 500 respectively disposed on the left front surface, the right front surface, and the middle rear surface. Furthermore, the left rear surface and the right rear surface of the storage chamber 100 are closed by the multiple exhaust parts 600 respectively disposed on the left rear surface and the right rear surface.

Thus, as shown in FIGS. 7a to 7c, the purge gas is injected into the storage chamber 100 from the left front, right front, and middle rear surfaces of the storage chamber 100 where the multiple injection parts 500 are disposed, and the purge gas having been injected into the storage chamber 100 and the fumes on the wafer W are exhausted from the left rear and right rear surfaces of the storage chamber 100 where the multiple exhaust parts 600 are disposed.

A Support 200

As shown in FIGS. 1 to 3 and FIGS. 7a to 7c, the support 200 supporting the wafer W is provided in the storage chamber 100.

Multiple supports 200 are provided in a vertical direction according to the number of wafers W stored in the storage chamber 100.

For example, in a case where thirty wafers W are stored in the storage chamber 100, thirty supports 200 are provided to respectively support the thirty wafers W.

The multiple supports 200 as described above are fixedly coupled to the left front, left rear, right front, and right rear surfaces of the storage chamber 100 by the support coupling portions 210.

Furthermore, the support 200 is provided with a step 230 stepped downwardly to partially overlap a circumferential edge portion of the wafer W, and three protruding pins 250 are provided at the step 230. Accordingly, the wafer W is supported on the support 200 in a state of being placed on the protruding pins 250.

As described above, the wafer W is supported on the support 200 in a state of being placed on the protruding pins 250, whereby a contact area between the wafer W and the support table 200 can be minimized and thus breakage of the wafer W due to contact can be minimized.

A Lower Plate 300 and an Upper Plate 400

As shown in FIGS. 1 to 3, the lower plate 300 forms the lower surface of the wafer storage container 10 and functions to close a lower portion of the storage chamber 100 and to supply the purge gas supplied from the outside of the wafer storage container 10 through the external supply part (not shown) to the injection part 500 or to discharge the purge gas exhausted from the exhaust part 600 and the fumes on the wafer W to the outside of the wafer storage container 10 through the external discharge part (not shown).

The multiple injection parts 500 and the multiple exhaust parts 600 are installed on an upper surface of the lower plate 300. Accordingly, the lower plate 300 functions to close injection spaces 550 of the multiple injection parts 500, exhaust spaces 650 of the multiple exhaust parts 600, and a lower surface of the storage chamber 100.

Multiple supply holes 310 are formed in the lower plate 300. The multiple supply holes 310 allow the external supply part and the injection spaces 550 of the injection parts 500 to communicate with each other such that the purge gas is supplied to the injection parts 500.

Furthermore, multiple discharge holes 330 are formed in the lower plate 300, and the multiple discharge holes 330 allow the external discharge part and the exhaust spaces 650 of the exhaust parts 600 to communicate with each other such that the fumes on the wafer W and the purge gas are discharged through the exhaust parts 600.

As shown in FIG. 3, two such supply holes 310 may be formed in each of the injection spaces 550 of the multiple injection parts 500. Accordingly, the multiple supply holes 310 must be formed in the lower plate 300 at respective positions corresponding to the injection spaces 550 of the injection parts 500.

As shown in FIG. 3, two discharge holes 330 may be formed in each of the exhaust spaces 650 of the multiple exhaust parts 600. Accordingly, the multiple discharge holes 330 must be formed in the lower plate 300 at respective positions corresponding to the exhaust spaces 650 of the exhaust parts 600.

Of course, the number of the supply holes 310 and the discharge holes 330 may vary depending on the size, application, etc. of the wafer storage container 10.

The upper plate 400 forms the upper surface of the wafer storage container 10, and the multiple injection parts 500 and the multiple exhaust parts 600 are installed on a lower surface of the upper plate 400. Accordingly, the upper plate 400 functions to close the injection spaces 550 of the multiple injection parts 500, the exhaust spaces 650 of the multiple exhaust parts 600, and an upper surface of the storage chamber 100.

Furthermore, multiple seat portions 410 are formed at the upper plate 400, and an injection blocking member actuating portion 540 of each of the injection parts 500 or an exhaust blocking member actuating portion 640 of each of the exhaust parts 600 is seated in each of the multiple seat portions 410.

Accordingly, the injection part 500 having the injection blocking member actuating portion 540 and the exhaust part 600 having the exhaust blocking member actuating portion 640 can be easily installed on the lower surface of the upper plate 400.

An Injection Part 500

Hereinafter, the injection part 500 will be described.

As shown in FIGS. 1 to 3, multiple injection parts 500 are disposed on the left front surface, the right front surface, and the middle rear surface of the circumferential surface of the storage chamber 100.

As shown in FIGS. 4 and 5, each of the injection parts 500 includes an injection hole wall 510 forming at least a portion of the circumferential surface of the storage chamber 100 and having an injection hole 511 through which the purge gas is injected into the storage chamber 100, an injection blocking member 530 blocking at least a portion of the injection hole 511, an injection part outer wall 520 coupled with the injection hole wall 510 and forming the outer surface of the wafer storage container 10, and an injection blocking member actuating portion 540 actuating the injection blocking member 530.

Multiple injection holes 511 are formed in the injection hole wall 510 and the injection holes 511 function as holes through which the purge gas is injected into the storage chamber 100.

In this case, the injection holes 511 may be formed to have multiple rows and columns. It is preferable that the rows of the injection holes 511 are the same number as the number of wafers W stored in the storage chamber 100, such that the purge gas is efficiently injected onto an upper surface of each of the wafers W.

FIGS. 4 and 5 exemplarily show that one hundred twenty injection holes 511 are formed in the injection hole wall 510 so as to form thirty rows and four columns. In this case, the number of the wafers W stored in the storage chamber 100 is thirty, and the number of supports 200 is also thirty.

The injection hole wall 510 functions as a portion of the circumferential surface of the storage chamber 100. Accordingly, the injection hole wall 510 of the injection part 500 disposed on the left front surface form the left front surface of the circumferential surface of the storage chamber 100 and the injection hole wall 510 of the injection part 500 disposed on the right front surface form the right front surface of the circumferential surface of the storage chamber 100, and the injection hole wall 510 of the injection part 500 disposed on the middle rear surface form the middle rear surface of the circumferential surface of the storage chamber 100.

The injection blocking member 530 has multiple injection communication holes 531 communicating with the injection holes 511 of the injection hole wall 510, and is disposed on a rear surface of the injection hole wall 510.

The injection communication holes 531 are formed with the same number of rows and columns as the injection holes 511 such that the injection communication holes correspond to the injection holes when the injection blocking member 530 is in a correct position.

Thus, as shown in FIG. 6a, when the injection blocking member 530 is in the correct position, the multiple injection communication holes 531 and the multiple injection holes 511 entirely communicate with each other, whereby the purge gas in the injection space 550 can be efficiently injected into the storage chamber 100 through the injection holes 511 and the injection communication holes 531.

Furthermore, as shown in FIG. 6b, when the injection blocking member 530 is in a blocking position, the multiple injection communication holes 531 and the multiple injection holes 511 are alternately offset from each other and thus do not communicate with each other. Accordingly, the purge gas in the injection space 550 is not allowed to be injected into the storage chamber 100.

The injection part outer wall 520 is a wall to which the injection hole wall 510 is coupled, and has a 'U' shape. Accordingly, the injection part outer wall 520 has a rear surface forming the outer surface of the wafer storage container 10.

The injection blocking member actuating portion 540 functions to allow the injection blocking member 530 to move vertically, that is, to move upwards and downwards such that the injection blocking member 530 is moved to the correct position or the blocking position. As shown in FIGS. 4, 5, 6a, and 6b, the injection blocking member actuating portion includes a body 541, a first connection portion 543 connecting the body 541 and the injection hole wall 510 to each other, and a second connection portion 545 connecting the body 541 and the injection blocking member 530 to each other.

The first connection portion 543 may be configured to extend and retract. As shown in FIG. 6b, when the first connection portion 543 extends, the injection blocking member 530 is moved upwards so that the injection blocking member 530 can be moved to the blocking position.

The first connection portion 543 may have a cylinder structure, a spiral screw structure that changes the length of the first connection portion 543 by rotation, etc.

The injection part 500 described above has the injection space 550 where the purge gas stays as shown in FIG. 3.

The injection space 550 is defined by the injection part outer wall 520, the injection hole wall 510 (or the injection blocking member 530), the upper plate 400, and the lower plate 300. In other words, the injection space 550 is defined such that the injection part outer wall 520 and the injection hole wall 510 (or injection blocking member 530) form a closed circumferential surface of the injection space 550, and the upper and lower plates 300 respectively form closed upper and lower surfaces of the injection space 550.

Thus, the purge gas supplied from the external supply part through the supply hole 310 to the injection space 550 can be efficiently injected from the injection space 550 into the storage chamber 100 through the injection holes 511 and the injection communication holes 531.

Furthermore, the injection blocking member 530 of the injection part 500 is disposed on the rear surface of the injection hole wall 510.

Accordingly, the support 200, the injection hole wall 510, and the injection blocking member 530 are disposed in an order from the inside to the outside of the wafer storage container 10.

Actuation of an Injection Blocking Member 530 of an Injection Part 500

Hereinafter, actuation of the injection blocking member 530 of the injection part 500 having the above-described configuration will be described with reference to FIGS. 6a and 6b.

As shown in FIG. 6a, when the injection blocking member actuating portion 540 is inoperative, the injection blocking member 530 is in the correct position, that is, a downwardly moved position, whereby the injection communication holes 531 of the blocking member 530 and the injection holes 511 of the injection hole wall 510 communicate with each other.

Accordingly, the purge gas is supplied from the external supply part to the injection space 550 through the supply hole 310, and then the purge gas having supplied to the injection space 550 is injected into the storage chamber 100 through the injection communication holes 531 and the injection holes 511.

As shown in FIG. 6b, when the injection blocking member actuating portion 540 is operative to extend the length of the first connection portion 543, the injection blocking member 530 connected to the second connection portion 545 is moved to the blocking position, that is, an upwardly moved position and blocks communication between the injection communication holes 531 of the injection blocking member 530 and the injection holes 511 of the injection hole wall 510.

In this case, the blocking the injection holes 511 is performed such that the injection holes 511 are closed in regions of a front surface of the injection blocking member 530, the region where no injection communication hole 531 is formed.

Thus, when the purge gas is supplied from the external supply part to the injection space 550 through the supply hole 310, the purge gas having been supplied to the injection space 550 is not allowed to be injected into the storage chamber 100 through the injection communication holes 531 and the injection holes 511.

As described above, the injection blocking member actuating portion 540 is operative to allow communication between the injection communication holes 531 of the injection blocking member 530 and the injection holes 511 of the injection hole wall 510, or allows the injection communication holes 531 of the injection blocking member 530 and the injection holes 511 of the injection hole wall 510 to be alternately offset from each other so as to block communication therebetween.

In addition, as shown in FIG. 6b, the injection blocking member actuating portion 540 may partially block communication between the injection communication holes 531 of the injection blocking member 530 and the injection holes 511 of the injection hole wall 510 as required.

In detail, when the injection blocking member actuating portion 540 moves the injection blocking member 530 upwards to a position lower than the blocking position of FIG. 6b, communication between the injection communication holes 531 and the injection holes 511 is partially blocked. Thus, the purge gas can be efficiently injected into the storage chamber 100 through the injection communication holes 531 and the injection holes 511.

In other words, the regions of the front surface of the injection blocking member 530 where no injection communication hole 531 is formed closes portions of the injection holes 511 whereby partial blocking of the injection holes 511 is achieved.

As such, the injection blocking member actuating portion 540 can completely block communication between the injection communication holes 531 and the injection holes 511, and can partially block communication between the injection communication holes 531 and the injection holes 511 and thus can partially block opening areas of the injection holes 511.

According to the actuating principle as described above, a controller 710 of FIG. 8 controls the operation of the injection blocking member actuating portion 540 to adjust the opening areas of the injection holes 511. A detailed description of such control of the controller 710 will be described later.

In order to facilitate the closing of the injection holes 511 by the injection blocking member 530, the injection communication holes 531 of the injection blocking member 530 may be configured such that a vertical distance, that is, a vertical spaced distance between each of the injection communication holes 531 and a neighboring injection communication hole 531 is greater than an area of the injection communication hole 531. In this case, the injection holes 511 of the injection hole wall 510 may be also configured such that a vertical distance, that is, a vertical spaced distance between each of the injection holes 511 and a neighboring injection hole 511 is greater than an area of the injection hole 511.

As described above, the wafer storage container 10 according to the first preferable embodiment of the present invention can block the injection holes 511 using the injection blocking member 530, thus achieving the following advantages.

Unlike a wafer storage container in the relate art in which purge gas supply into the storage chamber is blocked by shutting off a supply valve supplied with the purge gas, the injection blocking member 530 disposed on the rear surface of the injection hole wall 510 directly closes the injection holes 511 to block injection of the purge gas. Thus, injection of the purge gas can be quickly blocked.

In particular, even when a supply passage communicating with the supply valve and the injection part 500 has a long length, the injection blocking member 530 directly closes the injection holes 511 as described above to block injection of the purge gas. Thus, quick injection of the purge gas can be achieved without considering the position of the supply valve, thus ensuring excellent compatibility of the wafer storage container 10.

In addition, complete blocking of the injection holes 511 is possible as well as partial blocking of the injection holes 511, whereby an injection amount of the purge gas can be efficiently controlled.

Exhaust Part 600

Hereinafter, the exhaust part 600 will be described.

As shown in FIGS. 1 to 3, multiple exhaust parts 600 are disposed on the left rear surface and the right rear surface of the circumferential surface of the storage chamber 100.

As shown in FIGS. 4 and 5, each of the exhaust parts 600 includes an exhaust hole wall 610 having an exhaust hole 611 through which the purge gas injected into the storage chamber 100 is exhausted and forming at least a portion of the circumferential surface of the storage chamber 100, an exhaust blocking member 630 blocking at least a portion of the exhaust hole 611, an exhaust part outer wall 620 coupled with the exhaust hole wall 610 and forming the outer surface of the wafer storage container 10, and an exhaust blocking member actuating portion 640 actuating the exhaust blocking member 630.

Multiple exhaust holes 611 are formed in the exhaust hole wall 610, and the exhaust holes 611 function as holes through which the fumes on the wafer W and the purge gas injected into the storage chamber 100 are exhausted.

In this case, the exhaust holes 611 may be formed to have multiple rows and columns. It is preferable that the rows of the exhaust holes 611 are the same number as the number of wafers W stored in the storage chamber 100, such that the fumes present on the upper surfaces of the wafers W and the purge gas are efficiently exhausted through the exhaust holes 611.

FIGS. 4 and 5 exemplarily show that one hundred twenty exhaust holes 611 are formed in the exhaust hole wall 610 so as to have thirty rows and four columns. In this case, the number of the wafers W stored in the storage chamber 100 is thirty, and the number of supports 200 is also thirty.

The exhaust hole wall 610 functions as a portion of the circumferential surface of the storage chamber 100. Accordingly, the exhaust hole wall 610 of the exhaust part 600 disposed on the left rear surface forms the left rear surface of the circumferential surface of the storage chamber 100, and the exhaust hole wall 610 of the exhaust part 600 disposed on the right rear surface forms the right rear surface of the circumferential surface of the storage chamber 100.

The exhaust blocking member 630 has multiple exhaust communication holes 631 communicating with the exhaust holes 611 of the exhaust hole wall 610, and is disposed on a rear surface of the exhaust hole wall 610.

The exhaust communication holes 631 are formed with the same number of rows and columns as the exhaust holes 611 such that the exhaust communication holes correspond to the exhaust holes when the exhaust blocking member 630 is in a correct position.

Thus, as shown in FIG. 6a, when the exhaust blocking member 630 is in the correct position, the multiple exhaust communication holes 631 and the multiple exhaust holes 611 entirely communicate with each other, whereby the fumes on the wafer W and the purge gas in the storage chamber 100 can be efficiently exhausted to the exhaust space 650 through the exhaust communication holes 631 and the exhaust holes 611.

Furthermore, as shown in FIG. 6b, when the exhaust blocking member 630 is in a blocking position, the multiple exhaust communication holes 631 and the multiple exhaust holes 611 are alternately offset from each other and thus do not communicate with each other. Accordingly, the fumes on the wafer W and the purge gas in the storage chamber 100 are not allowed to be exhausted to the exhaust space 650.

The exhaust part outer wall 620 is a wall to which the exhaust hole wall 610 is coupled, and has a 'U' shape. Accordingly, the exhaust part outer wall 620 has a rear surface forming the outer surface of the wafer storage container 10.

The exhaust blocking member actuating portion 640 functions to allow the exhaust blocking member 630 to move vertically, that is, to move upwards and downwards such that the exhaust blocking member 630 is moved to the correct position or the blocking position. As shown in FIGS. 4, 5, 6a, and 6b, the exhaust blocking member actuating portion includes a body 641, a first connection portion 643 connecting the body 641 and the exhaust hole wall 610 to each other, and a second connection portion 645 connecting the body 641 and the exhaust blocking member 630 to each other.

The first connection portion 643 may be configured to extend and retract. As shown in FIG. 6b, when the first connection portion 643 extends, the exhaust blocking member 630 is moved upwards so that the exhaust blocking member 630 can be moved to the blocking position.

The first connection portion 643 may have a cylinder structure, a spiral screw structure that changes the length of the first connection portion 643 by rotation, etc.

The exhaust part 600 described above has the exhaust space 650 where the purge gas stays as shown in FIG. 3.

The exhaust space 650 is defined by the exhaust part outer wall 620, the exhaust hole wall 610 (or the exhaust blocking member 630), the upper plate 400, and the lower plate 300. In other words, the exhaust space 650 is defined such that the exhaust part outer wall 620 and the exhaust hole wall 610 (or the exhaust blocking member 630) form a closed circumferential surface of the exhaust space 650, and the upper and lower plates 300 respectively form closed upper and lower surfaces of the exhaust space 650.

Thus, the fumes on the wafer W and the purge gas that are exhausted from the storage chamber 100 to the exhaust space 650 through the exhaust holes 611 and the exhaust communication holes 631 can be efficiently exhausted to the external discharge part through the discharge holes 330 of the exhaust space 650.

Furthermore, the exhaust blocking member 630 of the exhaust part 600 is disposed on the rear surface of the exhaust hole wall 610, so that the exhaust hole wall 610 is positioned between the support 200 and the exhaust blocking member 610.

Accordingly, the support 200, the exhaust hole wall 610, and the exhaust blocking member 630 are disposed in an order from the inside to the outside of the wafer storage container 10.

Actuation of an Exhaust Blocking Member 630 of an Exhaust Part 600

Hereinafter, actuation of the exhaust blocking member 630 of the exhaust part 600 having the above-described configuration will be described with reference to FIGS. 6a and 6b.

As shown in FIG. 6a, when the exhaust blocking member actuating portion 640 is inoperative, the exhaust blocking member 630 is in the correct position, that is, a downwardly moved position, whereby the exhaust communication holes 631 of the exhaust blocking member 630 and the exhaust holes 611 of the exhaust hole wall 610 communicate with each other.

The purge gas injected into the storage chamber 100 and the fumes on the wafer W are exhausted to the exhaust space 650 through the exhaust communication holes 631 and the exhaust holes 611, and are then discharged to the external discharge part through the discharge holes 330 of the exhaust space 650.

As shown in FIG. 6b, when the exhaust blocking member actuating portion 640 is operative to extend the length of the first connection portion 643, the exhaust blocking member 630 connected to the second connection portion 645 is moved to the blocking position, that is, an upwardly moved position and blocks communication between the exhaust communication holes 631 of the exhaust blocking member 630 and the exhaust holes 611 of the exhaust hole wall 610.

In this case, the blocking of the exhaust holes 611 is performed such that the exhaust holes 611 are closed in regions of a front surface of the exhaust blocking member 630, the region where no exhaust communication hole 631 is formed.

Thus, the purge gas supplied to the storage chamber 100 and the fumes on the wafer W are not allowed to be exhausted to the exhaust space 650 through the exhaust communication holes 631 and the exhaust holes 611.

As described above, the exhaust blocking member actuating portion 640 is operative to allow communication between the exhaust communication holes 631 of the exhaust blocking member 630 and the exhaust holes 611 of the exhaust hole wall 610, or allows the exhaust communication holes 631 of the exhaust blocking member 630 and the exhaust holes 611 of the exhaust hole wall 610 to be alternately offset from each other so as to block communication therebetween.

In addition, as shown in FIG. 6b, the exhaust blocking member actuating portion 640 may partially block communication between the exhaust communication holes 631 of the exhaust blocking member 630 and the exhaust holes 611 of the exhaust hole wall 610 as required.

In detail, when the exhaust blocking member actuating portion 640 moves the exhaust blocking member 630 upwards to a position lower than the blocking position of FIG. 6b, communication between the exhaust communication holes 631 and the exhaust holes 611 is partially blocked. Thus, the purge gas can be efficiently exhausted from the storage chamber 100 through the exhaust communication holes 631 and the exhaust holes 611.

In other words, the regions of the front surface of the exhaust blocking member 630 where no exhaust communication hole 631 is formed closes portions of the exhaust holes 611 whereby partial blocking of the exhaust holes 611 is achieved.

As such, the exhaust blocking member actuating portion 640 can completely block communication between the exhaust communication holes 631 and the exhaust holes 611, and can partially block communication between the exhaust communication holes 631 and the exhaust holes 611 and thus can partially block opening areas of the exhaust holes 611.

According to the actuating principle as described above, the controller 710 of FIG. 8 controls the operation of the exhaust blocking member actuating portion 640 to adjust the opening areas of the exhaust holes 611. A detailed description of such control of the controller 710 will be described later.

In order to facilitate the closing of the exhaust holes 611 by the exhaust blocking member 630, the exhaust communication holes 631 of the exhaust blocking member 630 may be configured such that a vertical distance, that is, a vertical spaced distance between each of the exhaust communication holes 631 and a neighboring exhaust communication hole 631 is greater than an area of the exhaust communication hole 631. In this case, the exhaust holes 611 of the exhaust hole wall 610 may be also configured such that a vertical distance, that is, a vertical spaced distance between each of the exhaust holes 611 and a neighboring exhaust hole 611 is greater than an area of the exhaust hole 611.

As described above, the wafer storage container 10 according to the first preferable embodiment of the present invention can block the exhaust holes 611 using the exhaust blocking member 630, thus achieving the following advantages.

Unlike a wafer storage container in the related art in which purge gas exhaust from the storage chamber is blocked by shutting off a discharge valve discharging the purge gas, the exhaust blocking member 630 disposed on the rear surface of the exhaust hole wall 610 directly closes the exhaust holes 611 to block exhaust of the fumes on the wafer W and the purge gas. Thus, exhaust of the fumes on the wafer W and the purge gas can be quickly blocked.

In particular, even when a discharge passage communicating with the discharge valve and the exhaust part 600 has a long length, the exhaust blocking member 630 directly closes the exhaust holes 611 as described above to block exhaust of the fumes on the wafer W and the purge gas. Thus, quick exhaust of the fumes on the wafer W and the purge gas can be achieved without considering the position of the discharge valve, thus ensuring excellent compatibility of the wafer storage container 10.

In addition, complete blocking of the exhaust holes 611 is possible as well as partial blocking of the exhaust holes 611, whereby an exhaust amount of the fumes on the wafer W and the purge gas can be efficiently controlled.

Moreover, unlike the wafer storage container in the relate art in which purge gas exhaust from the storage chamber is blocked by shutting off the discharge valve discharging the purge gas, the exhaust blocking member 630 directly closes the exhaust holes 611 to block exhaust of the fumes on the wafer W and the purge gas. Thus, the fumes on the wafer W and the purge gas can be prevented from being trapped in an exhaust passage communicating with an exhaust valve and the exhaust part 600.

Accordingly, even when exhaust of the wafer storage container 10 is blocked, the fumes on the wafer W trapped in the exhaust passage, that is, the contaminants can be prevented from flowing into the storage chamber 100. Thus, it is possible to prevent contamination of the wafer W and to prevent inefficient humidity control of the storage chamber 100.

Purge Gas Injection Control and Exhaust Control of a Wafer Storage Container 10

Hereinafter, purge gas injection control and exhaust control of the fumes on the wafer W and the purge gas of the wafer storage container 10 according to the first preferable embodiment of the present invention having the above-described configuration will be described.

The wafer storage container 10 according to the first preferable embodiment of the present invention may have a control system 700, and the control system 700 includes, as shown in FIG. 8, a sensor for measuring the internal atmosphere of the storage chamber 100, the actuating portion for actuating the blocking member, and the controller 710 for controlling operation of the actuating portion based on a value measured by the sensor.

In this case, the sensor may include a humidity sensor 720 for measuring humidity in the storage chamber 100 and a pressure sensor 730 for measuring pressure in the storage chamber 100.

Furthermore, as described above, the blocking member may include the injection blocking member 530 disposed at the injection part 500 to block the injection holes 511 and the exhaust blocking member 630 disposed at the exhaust part 600 to block the exhaust holes 611. The actuating portion may include the injection blocking member actuating portion 540 for actuating the injection blocking member 530 and the exhaust blocking member actuating portion 640 for actuating the exhaust blocking member 630.

The humidity sensor 720 is provided in the storage chamber 100 and functions to measure humidity in the storage chamber 100.

The pressure sensor 730 is provided in the storage chamber 100 and functions to measure pressure in the storage chamber 100.

As such, the humidity sensor 720 and the pressure sensor 730 are provided in the storage chamber 100 to measure the internal atmosphere of the storage chamber 100.

The controller 710 controls operation of the injection blocking member actuating portion 540 or the exhaust blocking member actuating portion 640 based on values measured by the humidity sensor 720 and the pressure sensor 730, and thus to control purge gas injection and exhaust of the fumes on the wafer W and the purge gas of the wafer storage container 10.

Thus, the controller 710 is connected to the humidity sensor 720, the pressure sensor 730, the injection blocking member actuating portion 540, and the exhaust blocking member actuating portion 640 and thus can transmit and receive electrical signals to and from the humidity sensor 720, the pressure sensor 730, the injection blocking member actuating portion 540, and the exhaust blocking member actuating portion 640.

The control system 700 having the above configuration enables the wafer storage container 10 to achieve fume removal of the wafer W and humidity control of the storage chamber 100.

First, a description will be given of a fume removal operation of the wafer W stored in the wafer storage container 10.

The fumes as contaminants remain on the upper surface of the wafer W during a manufacturing process of the wafer W. Accordingly, in order to remove the fumes on the wafer W stored in the wafer storage container 10, the purge gas is injected from the injection parts 500 as shown in FIG. 7a.

In this case, as described above, the injection parts 500 are respectively disposed on the left front surface, the right front surface, and the middle rear surface of the circumferential surface of the storage chamber 100, so that the purge gas is injected from the left front surface, the right front surface, and the middle rear surface.

The purge gas injected into the storage chamber 100 in such a manner is injected onto the upper surfaces of multiple wafers W supported by the supports 200 and is exhausted together with the fumes on the wafers W 600 to the exhaust parts 600.

In this case, as described above, the exhaust parts 600 are respectively disposed on the left rear surface and the right rear surface of the circumferential surface of the storage chamber 100, so that the fumes on the wafers W and the purge gas are exhausted to the left rear surface and the right rear surface of the storage chamber 100.

In order to achieve such a fume removal operation of the wafer W, the injection blocking member 530 and the exhaust blocking member 630 must be in the correct positions as shown in FIG. 6a. In this case, the controller 710 does not operate the injection blocking member actuating portion 540 and the exhaust blocking member actuating portion 640.

In addition, the controller 710 operates the injection blocking member actuating portion 540 and the exhaust blocking member actuating portion 640 to control the injection amount of the purge gas from the injection part 500 and the exhaust amount of the fumes on the wafer W and the purge gas to the exhaust part 600.

In other words, when a user manipulates the controller 710 to reduce the injection amount of the purge gas from the injection part 500, the controller 710 transmits an electrical signal to the injection blocking member actuating portion 540 to operate the injection blocking member actuating portion 540. Accordingly, the injection blocking member 530 is moved upwards, whereby the injection holes 511 and the injection communication holes 531 are alternately offset from each other.

However, in this case, the injection blocking member 530 is moved upwards to a position lower than that of FIG. 6b, and communication between the injection holes 511 and the injection communication holes 531 is partially blocked rather than completely blocked. Thus, the opening areas of the injection holes 511 are reduced, so that the injection amount of the purge gas injected through the injection holes 511 is reduced.

In addition, when a user manipulates the controller 710 to reduce the exhaust amount of the fumes on the wafer W and the purge gas to the exhaust part 600, the controller 710 transmits an electrical signal to the exhaust blocking member actuating portion 640 to operate the exhaust blocking member actuating portion 640. Accordingly, the exhaust blocking member 630 is moved upwards, whereby the exhaust holes 611 and the exhaust communication holes 631 are alternately offset from each other.

However, in this case, the exhaust blocking member 630 is moved upwards to a position lower than that of FIG. 6b, and communication between the exhaust holes 611 and the exhaust communication holes 631 is partially blocked rather than completely blocked. Thus, the opening areas of the exhaust holes 611 are reduced, so that the exhaust amount of the fumes on the wafer W and the purge gas exhausted through the exhaust holes 611 is reduced.

The injection amount control and the exhaust amount control by the controller 710 as described above may be automatically performed by predetermining a limit value in the controller 710 as well as a user operation.

Hereinafter, a humidity control operation of the storage chamber 100 of the wafer storage container 10 will be described.

In a case where humidity in the storage chamber 100 is high, oxidation of the wafer W stored in the storage chamber 100 is promoted. Such oxidation of the wafer W causes the wafer W to be defective.

Accordingly, the wafer storage container 10 can fill the storage chamber 100 with the purge gas, which is an inert gas, to lower humidity in the storage chamber 100, thus preventing oxidation of the wafer W.

In order to achieve such humidity control, that is, dehumidification, firstly when a humidity value measured by the humidity sensor 720 is equal to or greater than a predetermined humidity limit value, the controller 710 operates the exhaust blocking member 630 to block exhaust of the fumes on the wafer W and the purge gas to the exhaust part 600.

Thus, as shown in FIG. 7b, the purge gas is injected into the storage chamber 100 from the injection part 500, and the purge gas is filled in the storage chamber 100.

In this case, as described above, the purge gas is injected from the left front surface, the left rear surface, and the middle rear surface of the circumferential surface of the storage chamber 100.

When the purge gas is filled in the storage chamber 100 and a pressure value measured by the pressure sensor 730 is equal to or greater than a predetermined pressure limit value, the injection blocking member 530 is operated to block purge gas injection from the inject part 500.

In addition, when humidity in the storage chamber 100 is lowered and thus a humidity value measured by the humidity sensor 720 is less than the predetermined humidity limit value, and a pressure value measured by the pressure sensor 730 is equal to or greater than the predetermined pressure limit value, the controller 710 operates the exhaust blocking member 630 to allow exhaust of the purge gas to the exhaust part 600.

Thus, as shown in FIG. 7c, the purge gas in the storage chamber 100 is exhausted to the exhaust part 600.

When the controller 710 of the control system 700 described above operates the injection blocking member 530 of the injection part 500 to block the injection holes 511, the controller 710 may shut off the supply valve (not shown) provided at the supply passage (not shown) communicating with the external supply part and the injection part 500 to prevent pressure in the injection space 550 from raising due to the purge gas filled in the injection space 550.

As described above, the wafer storage container 10 according to the first preferable embodiment of the present invention is characterized in that the controller 710 of the control system 700 enables simultaneously achieving both prevention of oxidation of the wafer W due to humidity control of the storage chamber 100 and fume removal of the wafer S.

A Wafer Storage Container 10' According a Second Preferable Embodiment of the Present Invention Hereinafter, a wafer storage container 10' according to a second preferable embodiment of the present invention will be described with reference to FIGS. 9a to 9c.

Figure 9A:
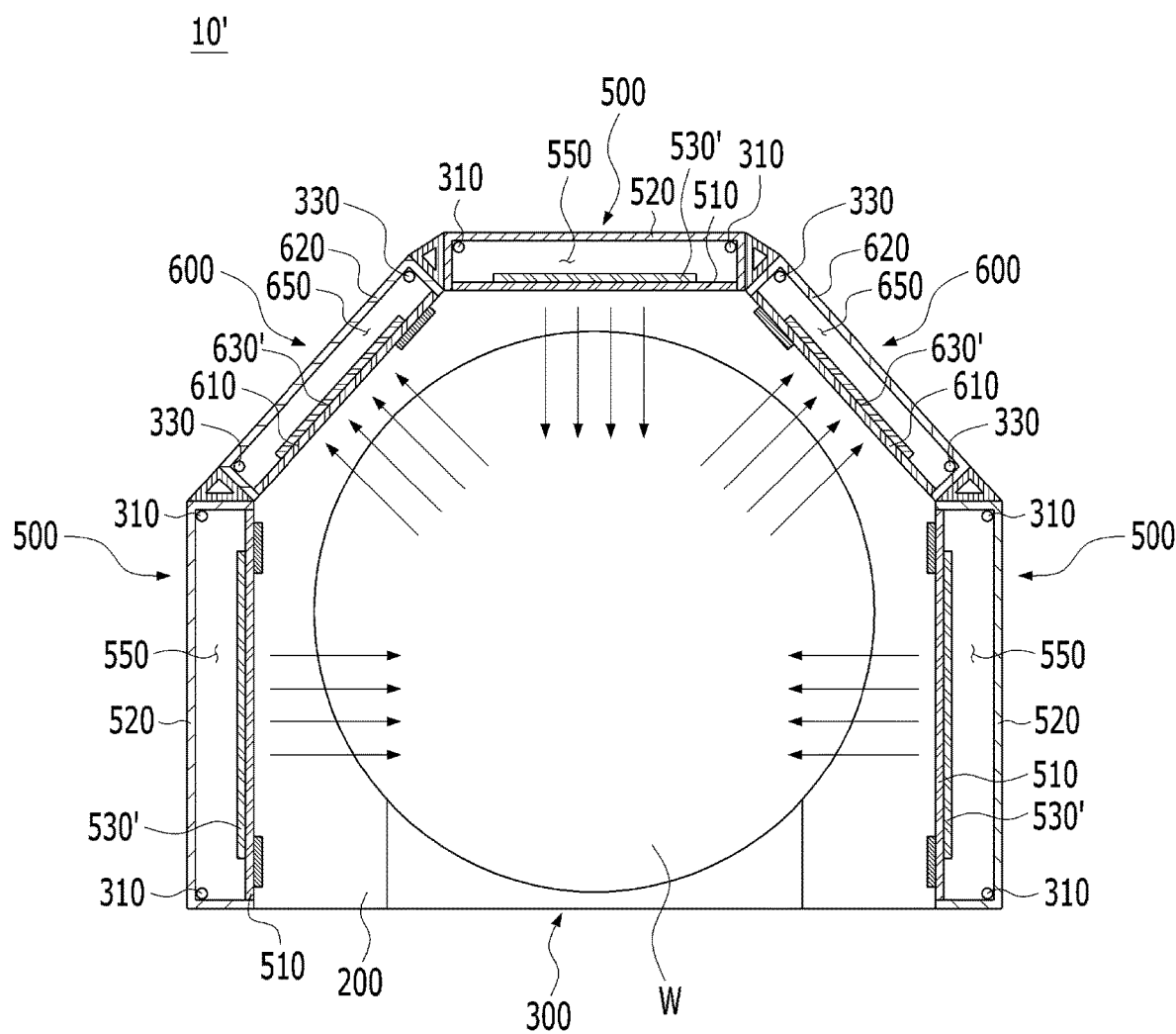
FIG. 9a is a plan cross-sectional view showing injection flow and exhaust flow of the purge gas in a wafer storage container according to a second preferable embodiment of the present invention.
Figure 9B:
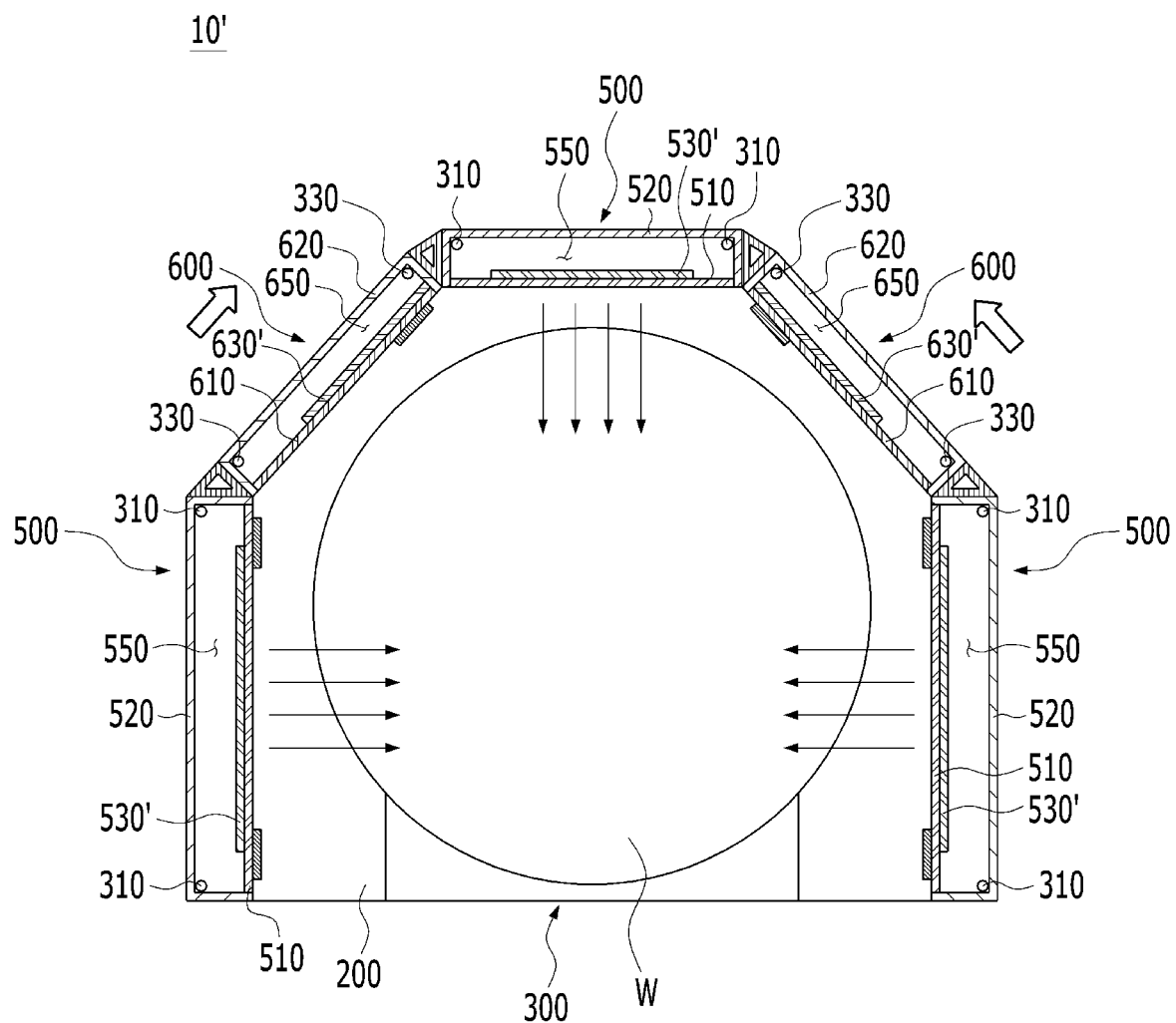
FIG. 9b is a plan cross-sectional view showing the injection flow of the purge gas in the wafer storage container according to the second preferable embodiment of the present invention.
Figure 9C:
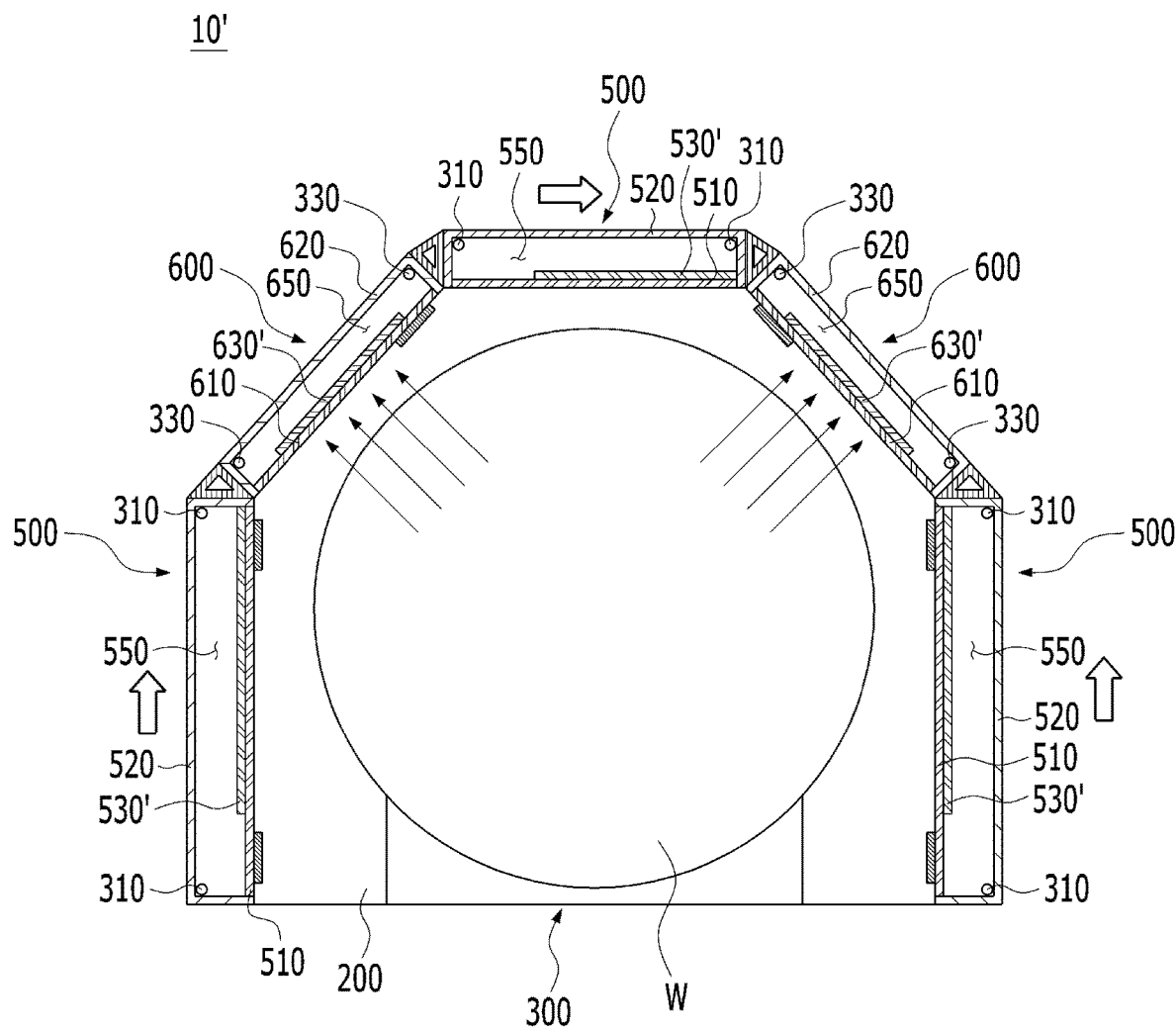
FIG. 9c is a plan cross-sectional view showing the exhaust flow of the purge gas in the wafer storage container according to the second preferable embodiment of the present invention.

FIG. 9a is a plan cross-sectional view showing injection flow and exhaust flow of the purge gas in a wafer storage container according to a second preferable embodiment of the present invention, FIG. 9b is a plan cross-sectional view showing the injection flow of the purge gas in the wafer storage container according to the second preferable embodiment of the present invention, and FIG. 9c is a plan cross-sectional view showing the exhaust flow of the purge gas in the wafer storage container according to the second preferable embodiment of the present invention.

The wafer storage container 10' according to the second preferable embodiment of the present invention is different from the wafer storage container 10 according to the first preferable embodiment of the present invention in that moving directions of an injection blocking member 530' and an exhaust blocking member 630' vary but the remaining components are the same.

Therefore, a description of the remaining components will be replaced with the description of the wafer storage container 10' according to the first preferable embodiment of the present invention.

The injection blocking member 530' and the exhaust blocking member 630' of the wafer storage container 10' according to the second preferable embodiment of the present invention may be moved horizontally by the actuating portion.

In this case, FIG. 9a shows that the injection blocking member 530' and the exhaust blocking member 630' are in correct positions, and FIG. 9b shows that the exhaust blocking member 630' is in a blocking position, and FIG. 9c shows that the injection blocking member 530' is in a blocking position.

When the controller 710 operates the actuating portion to move the injection blocking member 530' from the correct position to the blocking position, the injection blocking member 530' is moved horizontally and thus is changed in position from the position of FIG. 9a to the position of FIG. 9c.

Thus, the injection communication hole 531s of the injection blocking member 530' and the injection holes 511 of the injection hole wall 510 are alternately offset from each other, whereby the injection blocking member 530' closes the injection holes 511 to block the injection holes 511.

Furthermore, when the controller 710 operates the actuating portion to move the exhaust blocking member 630' from the correct position to the blocking position, the exhaust blocking member 630' is moved horizontally and thus is changed in position from the position of FIG. 9a to the position of FIG. 9b.

Thus, the exhaust communication holes 631 of the exhaust blocking member 630' and the exhaust holes 611 of the exhaust hole wall 610 are alternately offset from each other, whereby the exhaust blocking member 630' closes the exhaust holes 611 to block the exhaust holes 611.

In this case, the actuating portion for actuating the injection blocking member 530' may be provided in the injection space 550, and allows the injection blocking member 530' to slide horizontally. In addition, the actuating portion for actuating the exhaust blocking member 630' may be provided in the exhaust space 650 and allows the exhaust blocking member 630' to slide horizontally.

In order to facilitate the closing of the injection holes 511 by the injection blocking member 530', the injection communication holes 531 of the injection blocking member 530' may be configured such that a horizontal distance, that is, a horizontal spaced distance between each of the injection communication holes 531 and a neighboring injection communication hole 531 is greater than an area of the injection communication hole 531. In this case, the injection holes 511 of the injection hole wall 510 may be also configured such that a horizontal distance, that is, a horizontal spaced distance between each of the injection holes 511 and a neighboring injection hole 511 is greater than an area of the injection hole 511.

Furthermore, in order to facilitate the closing of the exhaust holes 611 by the exhaust blocking member 630', the exhaust communication holes 631 of the exhaust blocking member 630' may be configured such that a horizontal distance, that is, a horizontal spaced distance between each of the exhaust communication holes 631 and a neighboring exhaust communication hole 631 is greater than an area of the exhaust communication hole 631. In this case, the exhaust holes 611 of the exhaust hole wall 610 may be also configured such that a horizontal distance, that is, a horizontal spaced distance between each of the exhaust holes 611 and a neighboring exhaust hole 611 is greater than an area of the exhaust hole 611.

The wafer storage container 10' according to the second preferable embodiment of the present invention having the above-described configuration is characterized in that the actuating portion is provided in the injection space 550 and in the exhaust space 650, resulting in a wafer storage container 10 that is more compact than the wafer storage container 10 according to the first preferable embodiment of the present invention.

A Wafer Storage Container 10" According to a Third Preferable Embodiment of the Present Invention Hereinafter, a wafer storage container 10" according to a second preferable embodiment of the present invention will be described with reference to FIGS. 10a to 10c.

Figure 10A:
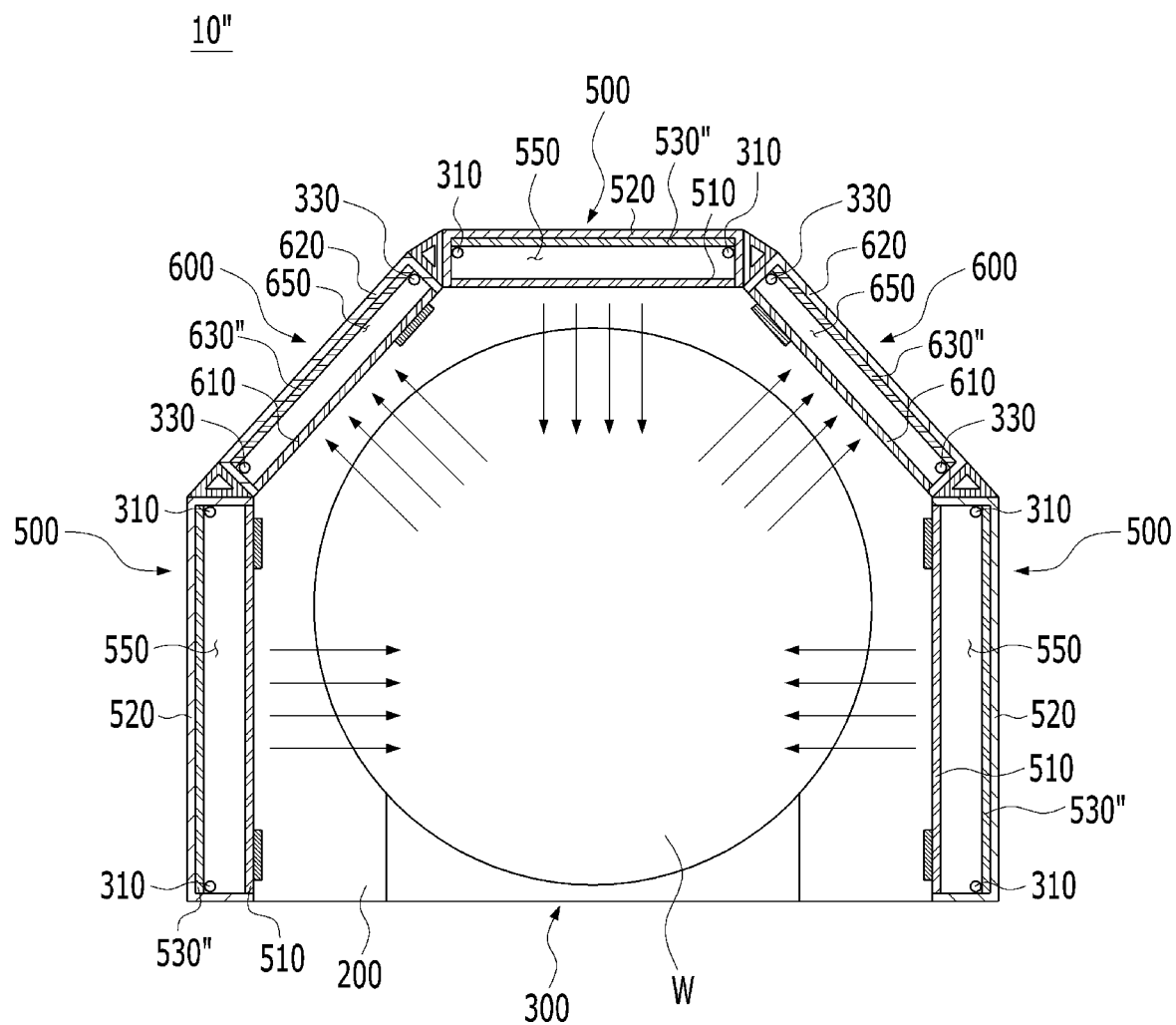
FIG. 10a is a plan cross-sectional view showing injection flow and exhaust flow of the purge gas in a wafer storage container according to a third preferable embodiment of the present invention.
Figure 10B:
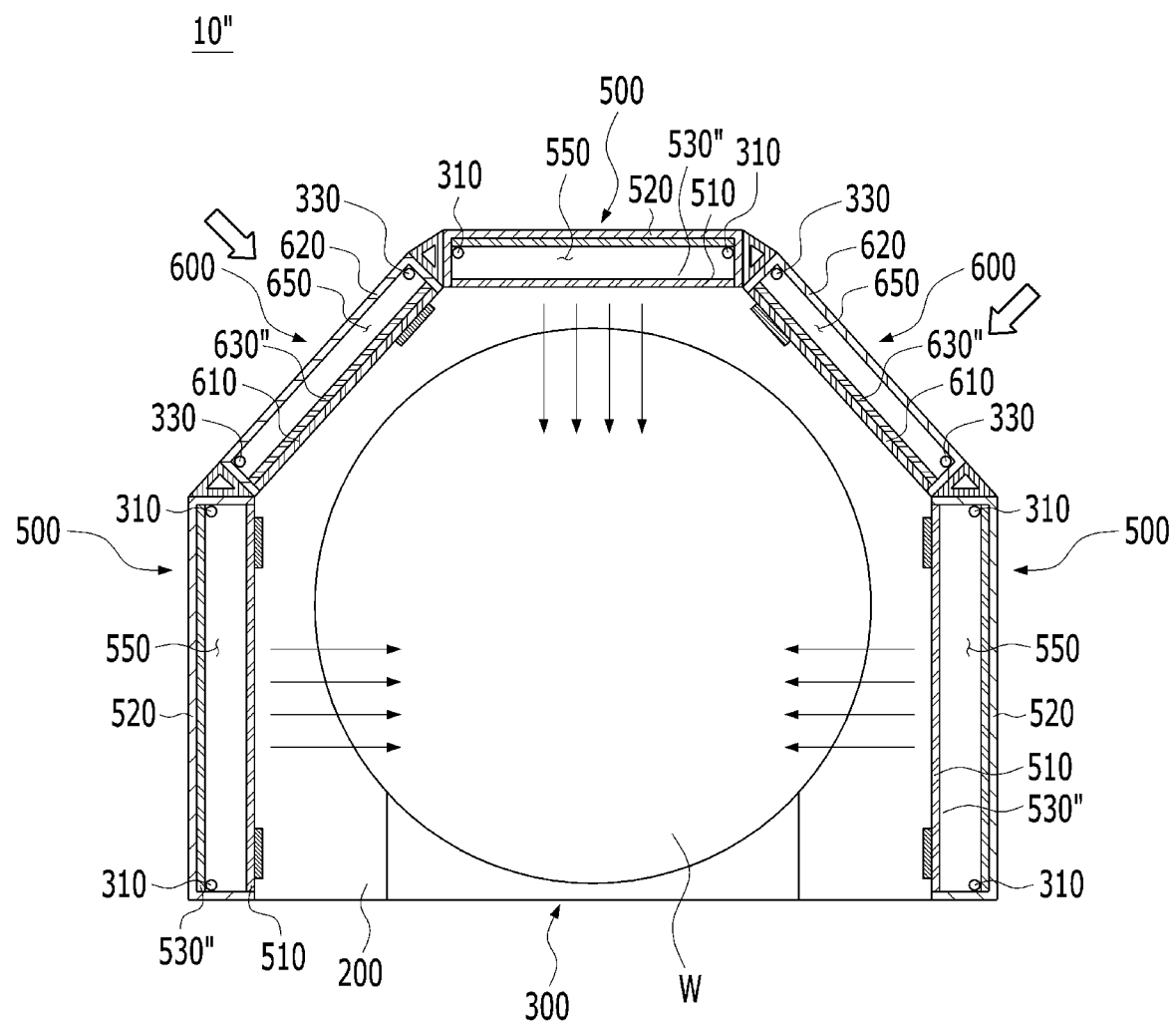
FIG. 10b is a plan cross-sectional view showing the injection flow of the purge gas in the wafer storage container according to the third preferable embodiment of the present invention.
Figure 10C:
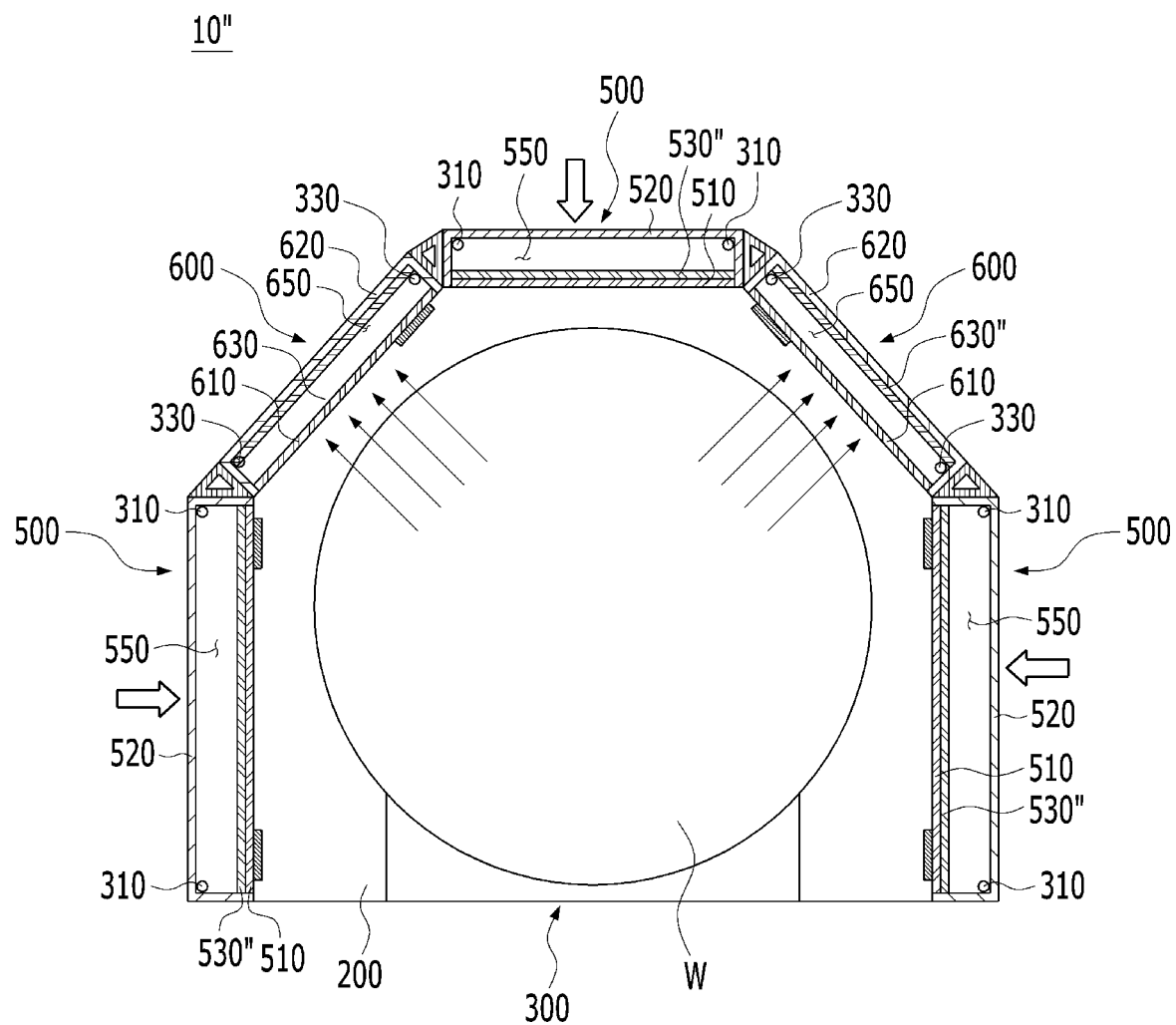
FIG. 10c is a plan cross-sectional view showing the exhaust flow of the purge gas in the wafer storage container according to the third preferable embodiment of the present invention.

FIG. 10a is a plan cross-sectional view showing injection flow and exhaust flow of the purge gas in a wafer storage container according to a third preferable embodiment of the present invention, FIG. 10b is a plan cross-sectional view showing the injection flow of the purge gas in the wafer storage container according to the third preferable embodiment of the present invention, and FIG. 10c is a plan cross-sectional view showing the exhaust flow of the purge gas in the wafer storage container according to the third preferable embodiment of the present invention.

The wafer storage container 10" according to the third preferable embodiment of the present invention is different from the wafer storage container 10 according to the first preferable embodiment of the present invention in that moving directions of an injection blocking member 530" and an exhaust blocking member 630" vary but the remaining components are the same.

Therefore, a description of the remaining components will be replaced with the description of the wafer storage container 10 according to the first preferable embodiment of the present invention.

The injection blocking member 530" of the wafer storage container 10" according to the third preferable embodiment of the present invention may be moved by the actuating portion horizontally in a direction from a rear surface of the injection part outer wall 520 to the injection hole wall 510.

Furthermore, the exhaust blocking member 630" of the wafer storage container 10 to the third preferable embodiment of the present invention may be moved by the actuating portion horizontally in a direction from a rear surface of the exhaust part outer wall 620 to the exhaust hole wall 610.

In addition, no injection communication hole and exhaust communication hole are formed in the injection blocking member 530" and the exhaust blocking member 630".

In this case, FIG. 10a shows that the injection blocking member 530" and the exhaust blocking member 630" are in correct positions, and FIG. 10b shows that the exhaust blocking member 630" is in a blocking position, and FIG. 10c shows that the injection blocking member 530" is in a blocking position.

When the controller 710 operates the actuating portion to move the injection blocking member 530" from the correct position to the blocking position, the injection blocking member 530" is moved horizontally in the direction from the rear surface of the injection part outer wall 520 to the injection hole wall 510 and thus is changed in position from the position of FIG. 10a to the position of FIG. 9c.

Thus, a front surface of the injection blocking member 530" blocks the injection holes 511 of the injection hole wall 510.

Furthermore, when the controller 710 operates the actuating portion to move the exhaust blocking member 630" from the correct position to the blocking position, the exhaust blocking member 630" is moved horizontally in the direction from the rear surface of the exhaust part outer wall 620 to the exhaust hole wall 610 and thus is changed in position from the position of FIG. 10a to the position of FIG. 10b.

Thus, a front surface of the exhaust blocking member 630" blocks the exhaust holes 611 of the exhaust hole wall 610.

In this case, the actuating portion for actuating the injection blocking member 530" may be provided in the injection space 550 and allows the injection blocking member 530" to slide horizontally. In addition, the actuating portion for actuating the exhaust blocking member 630" may be provided in the exhaust space 650" and allows the exhaust blocking member 630" to slide horizontally.

The wafer storage container 10" according to the third preferable embodiment of the present invention having the above-described configuration is characterized in that the actuating portion is provided in the injection space 550 and in the exhaust space 650, resulting in a wafer storage container 10 that is more compact than the wafer storage container 10 according to the first preferable embodiment of the present invention.

Moreover, the injection blocking member 530" and the exhaust blocking member 630" are provided with no communication hole communicating with the injection holes 511 and the exhaust holes 611, so that the injection blocking member 530" and the exhaust blocking member 630" can be more easily manufactured, thus reducing manufacturing cost and preventing malfunction of the injection blocking member 530" and the exhaust blocking member 630".

It is preferable that the blocking members, that is, the injection blocking members 530, 530', and 530" and the exhaust blocking members 630, 630', and 630" of the wafer storage container 10, 10', and 10" according to the first to third preferable embodiment of the present invention described above are made of a material capable of preventing corrosion.

This is because when the injection blocking members 530, 530', and 530" and the exhaust blocking members 630, 630', and 630" become corroded by contaminants such as fumes on the wafer W, etc., blocking of injection of the injection part or blocking of exhaust of the exhaust part 600 may not achieved.

Thus, the injection blocking members 530, 530', and 530" and the exhaust blocking members 630, 630', and 630" may be configured such that the injection blocking members 530, 530', and 530" and the exhaust blocking members 630, 630', and 630" may be coated with a fluorine resin such as Teflon (registered trademark), etc. Alternatively, in a case where the injection blocking members 530, 530', and 530" and the exhaust blocking members 630, 630', and 630" are made of a metal material, an anodic oxide film may be formed thereon. For example, in a case where the injection blocking members 530, 530', and 530" and the exhaust blocking members 630, 630', and 630" are made of aluminum, an anodic aluminum oxide layer formed by anodizing aluminum may be formed thereon.

Although a preferred embodiment of the present invention has been described for illustrative purposes, those skilled in the art will appreciate that various modifications, additions and substitutions are possible, without departing from the scope and spirit of the invention as disclosed in the accompanying claims.

DESCRIPTION OF THE REFERENCE
NUMERALS IN THE DRAWINGS 10, 10', 10": wafer storage container
100: storage chamber
110: front opening
210: support coupling portion
250: protruding pin
310: supply hole
400: upper plate
500: injection part
510: injection hole wall
511: injection hole
520: injection part outer wall
530, 530', 530": injection blocking member
531: injection communication hole
540: injection blocking member actuating portion
541: body
543: first connection portion
545: second connection portion
200: support
230: step
300: lower plate
330: discharge hole
410: seat portion -continued 550: injection space
600: exhaust part
610: exhaust hole wall
611: exhaust hole
620: exhaust part outer wall
630, 630', 630": exhaust blocking member
631: exhaust communication hole
640: exhaust blocking member actuating portion
641: body
643: first connection portion
645: second connection portion
650: exhaust space
700: control system         710: controller
720: humidity sensor        730: pressure sensor
W: wafer

The invention claimed is:

1. A wafer storage container, comprising:
a storage chamber in which a wafer received through a front opening is stored;
an injection hole through which purge gas is injected into the storage chamber from an injection space;
an exhaust hole through which the purge gas injected into the storage chamber is exhausted to an exhaust space;
a blocking member provided within one of the injection space and the exhaust space and configured to block at least a portion of the one of the injection hole and the exhaust hole;
an injection hole wall forming at least a portion of a circumferential surface of the storage chamber and having the injection hole;
an exhaust hole wall having the exhaust hole and forming a remaining portion of the circumferential surface of the storage chamber, the remaining portion not having the injection hole wall positioned thereon; and
a support supporting the wafer stored in the storage chamber,
wherein the one of the injection hole wall and the exhaust hole wall is positioned between the support and the blocking member.

2. The wafer storage container of claim 1, further comprising:
a communication hole formed in the blocking member to communicate with at least one of the injection hole and the exhaust hole; and
an actuating portion allowing the blocking member to move such that the communication hole of the blocking member and at least one of the injection hole and the exhaust hole are alternately offset from each other and thus do not communicate with each other.

3. The wafer storage container of claim 2, wherein the actuating portion allows the blocking member to move vertically.

4. The wafer storage container of claim 2, wherein the actuating portion allows the blocking member to move horizontally.

5. The wafer storage container of claim 1, further comprising:
an actuating portion allowing the blocking member to move horizontally in a direction of at least one of the injection hole wall and the exhaust hole wall such that at least the portion of at least one of the injection hole and the exhaust hole is blocked.

6. The wafer storage container of claim 1, further comprising:
an actuating portion allowing the blocking member to move such that at least the portion of at least one of the injection hole and the exhaust hole is blocked;
a sensor measuring an internal atmosphere of the storage chamber; and
a controller controlling operation of the actuating portion based on a humidity value measured by the sensor.

7. The wafer storage container of claim 1, further comprising:
an injection part outer wall coupled to the injection hole wall and forming a first portion of an outer surface of the wafer storage container; and
an exhaust part outer wall coupled to the exhaust hole wall and forming a second portion of the outer surface of the wafer storage container,
wherein the injection part outer wall and the injection hole wall define the injection space, and
wherein the exhaust part outer wall and the exhaust hole wall define the exhaust space.

* * * * *